United States Patent
Kaneko et al.

(10) Patent No.: US 6,927,442 B2
(45) Date of Patent: *Aug. 9, 2005

(54) CHARGE PUMP DEVICE

(75) Inventors: Satoru Kaneko, Kumagaya (JP);
Toshiyuki Ohkoda, Oizumi-machi (JP);
Takao Myono, Menuma-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/329,722

(22) Filed: Dec. 26, 2002

(65) Prior Publication Data

US 2003/0155614 A1 Aug. 21, 2003

(30) Foreign Application Priority Data

Dec. 28, 2001 (JP) ........................................ 2001-401190

(51) Int. Cl.[7] .............................................. H01L 29/72
(52) U.S. Cl. ...................... 257/299; 257/335; 257/368; 257/369; 257/371; 257/373
(58) Field of Search ................. 257/299, 335, 257/369, 371–373, 368, 372; 438/208, 220, 223–224, 227–228, 203–204

(56) References Cited

U.S. PATENT DOCUMENTS

| | | | | |
|---|---|---|---|---|
| 4,115,794 A | * | 9/1978 | De La Moneda | ........... 257/299 |
| 4,639,761 A | | 1/1987 | Singer et al. | |
| 5,204,541 A | * | 4/1993 | Smayling et al. | ........... 257/138 |
| 5,330,922 A | * | 7/1994 | Erdeljac et al. | ............. 438/207 |
| 5,408,125 A | * | 4/1995 | Erdeljac et al. | ............. 257/607 |
| 5,643,820 A | * | 7/1997 | Williams et al. | ............ 438/394 |
| 5,648,281 A | * | 7/1997 | Williams et al. | ............ 438/358 |
| 6,218,895 B1 | * | 4/2001 | De et al. | ..................... 327/566 |
| 6,570,229 B1 | * | 5/2003 | Harada | ........................ 257/373 |
| 2002/0105021 A1 | * | 8/2002 | Myono et al. | ............... 257/299 |
| 2003/0141530 A1 | * | 7/2003 | Kaneko et al. | ............. 257/299 |
| 2003/0146476 A1 | * | 8/2003 | Kaneko et al. | ............. 257/368 |
| 2003/0164511 A1 | * | 9/2003 | Kaneko et al. | ............. 257/215 |
| 2003/0173609 A1 | * | 9/2003 | Kaneko et al. | ............. 257/299 |

* cited by examiner

Primary Examiner—Jennifer M. Kennedy
(74) Attorney, Agent, or Firm—Fish & Richardson P.C.

(57) ABSTRACT

A semiconductor device for a charge pump device suitable for providing large current capacity and preventing a latch up from occurring is offered. A first and a second N-type epitaxial silicon layers are stacked on a P-type single crystalline silicon substrate, and P-type well regions are formed in the second epitaxial silicon layer. P+-type buried layers abutting on bottoms of the P-type well regions and N+-type buried layers abutting on bottoms of the P+-type buried layers and electrically isolating the P-type well regions from the single crystalline silicon substrate are formed. An MOS transistor is formed in each of the P-type well regions and a drain layer of the MOS transistor and each of the P-type well regions are electrically connected.

3 Claims, 19 Drawing Sheets

CHARGE PUMP DEVICE

BACKGROUND OF THE INVENTION

1. Field of the Invention

This invention relates to a semiconductor device and its manufacturing method, specifically to a charge pump device with large current capacity used for a power supply circuit. Performance of the charge pump device can be improved and a latch up can be prevented with this invention.

2. Description of the Related Art

Video equipment in recent years such as a camcorder, a digital still camera (DSC) and a mobile phone with DSC use CCDs (charge-coupled devices) to capture an image. A CCD drive circuit for driving the CCDs requires a power supply circuit that provides both positive and negative high voltages (over 10 volts) and a large current (several milliamperes). A switching regulator is used for that purpose today The switching regulator can generate a high voltage with high performance, i.e. with high power efficiency (output power/input power). However, it has a drawback to generate a harmonic noise when switching a current. Therefore, the power supply has to be used with a noise shield. In addition to that, it requires a coil as an external part.

Consequently, a Dickson charge pump device has come to attention as a power supply circuit for portable equipment described above. The Dickson charge pump device is described in detail in a technical journal "John F. Dickson 'On-chip High-Voltage Generation in MNOS Integrated Circuits Using an Improved Voltage Multiplier Technique', IEEE JOURNAL OF SOLID-STATE CIRCUITS, VOL.SC-11, NO.3, pp.374–378, JUNE 1976", for example.

FIG. 18 shows a circuit diagram of a four-stage Dickson charge pump device. Diodes D1–D5 are connected in series. Each of coupling capacitors C1–C4 is connected to each of connecting nodes between the diodes D1–D5. CL refers to an output capacitor. CLK and CLKB are input clock pulses having opposite phase to each other. The CLK and CLKB are inputted to a clock driver 51. A numeral 52 refers to a current load. The clock driver 51 is provided with a power supply voltage Vdd. Herewith, an output amplitude of the clock pulses Φ1 and Φ2 outputted from the clock driver 51 becomes Vdd. The clock pulse Φ1 is fed to the capacitors C2 and C4, while the clock pulse Φ2 is fed to the capacitors C1 and C3.

In a stable state, in which a constant current Iout flows out, an input current to the charge pump device is a sum of a current from an input voltage Vin and a current provided from the clock driver. These currents are as described below, disregarding charging/discharging currents to/from stray capacitors. During a period of Φ1=High and Φ2=Low, an average current of 2 Iout flows through each of paths in directions depicted in the figure as solid line arrows.

During a period of Φ1=Low and Φ2=High, an average current of 2 Iout flows through each of paths in directions depicted in the figure as dashed line arrows. An average current of each of these currents over a clock cycle is Iout. A boosted voltage from the charge pump device in the stable state is expressed by an equation (1), $$Vout = Vin \cdot Vd + n(V_\phi' \cdot V1 \cdot Vd) \tag{1}$$

where $V_\phi'$ refers to an amplitude of a voltage at each of the connecting nodes induced through the coupling capacitor by a change in the clock pulse; V1 denotes a voltage drop due to the output current Iout; Vin denotes the input voltage, which is usually set at Vdd in positive voltage boosting and at 0 V in negative voltage boosting; Vd refers to a forward bias diode voltage; and n denotes a number of stages of pumping. Furthermore, V1 and $V_\phi'$ are expressed by following equations, $$V1 = Iout/(f(C+Cs)) = (2Iout\ T/2)/(C+Cs) \tag{2}$$

$$V_\phi' = V_\phi C/(C+Cs) \tag{3}$$

where C1–C4 denote clock coupling capacitances; Cs denotes a stray capacitance at each of the connecting nodes; $V_\phi$ denotes the amplitude of the clock pulses; f denotes a frequency of the clock pulses; and T denotes a clock period of the clock pulses. Power efficiency of the charge pump device is expressed by following equation, disregarding charging/discharging currents from/to the clock driver to/from the stray capacitors and assuming Vin=Vdd.

$$\eta = Vout\ Iout/((n+1)Vdd\ Iout) = Vout/((n+1)Vdd) \tag{4}$$

In this way, the charge pump device boosts the voltage by successively transferring electric charge to a next stage using a diode as a charge transfer device. However, an MOS transistor is easier than a PN junction diode to implement in a semiconductor integrated circuit because of compatibility of the manufacturing process.

For this reason, using MOS transistors as the charge transfer devices in place of the diodes D1–D5 has been proposed. In this case, Vd in the equation (1) is replaced with Vth representing a threshold voltage of the MOS transistor.

The inventors have investigated applying the charge pump device to a power supply circuit. The inventors have found following issues.

The first issue is to reduce ON resistance of a charge transfer MOS transistor, so that the charge pump circuit can provide a high voltage (over 10V) and a large current (several milliamperes) required to the power supply circuit.

The second issue is to prevent a latch up, which often happens to a high current charge pump device. Especially, there has been a problem with a large current charge pump device to cause a latch up at the beginning of the operation. The mechanism of the latch up based on the investigation made by the inventors will be described hereinafter.

FIG. 20 is a cross-sectional view showing a charge pump device implemented in a CMOS structure.

The structure shown in the cross-sectional view corresponds to that of the charge transfer MOS transistors M2 and M3 shown in FIG. 19. Separate P-type well regions 31 and 32 are formed in an N-type well region 20 formed in a surface of a P-type semiconductor substrate 10. And the charge transfer MOS transistor M2 is formed in the P-type well region 31. The charge transfer MOS transistor M3 is formed in the P-type well region 32.

Detailed explanation on the charge transfer MOS transistor M2 formed in the P-type well region 31 is given hereinafter. A drain layer D and a source layer S, both of which are N+-type, are formed in the surface of the P-type well region 31. P+ layers 41, having higher impurity concentration than the P-type well region 31, are formed in the P-type well region 31. The drain layer D and the P+ layers 41 are electrically connected with an aluminum interconnection or the like.

Since the drain D of the charge transfer transistor M2 and the P-type well region 31, in which the charge transfer MOS transistor M2 is formed, are electrically connected through low resistance, an increase in a threshold voltage Vth of the charge transfer transistor M2 due to a back gate effect is surely prevented. The charge transfer transistor M3 formed in the P-type well region 32 is structured similarly. Also, other charge transfer transistors M1, M4 and M5, which are not shown in the figure, are structured similarly.

By providing the N-type well region 20 with the boosted output voltage Vout from the charge pump device, the N-type well region 20 is reverse biased against the P-type well regions 31 and 32 in a steady state.

However, it has turned out that when the P-type well regions 31 and 32 are formed in a single N-type well region 20 as described above, a phenomenon like a latch up occurs and the output voltage Vout is hardly boosted. The inventors estimate the cause of the occurrence of the phenomenon as described below.

First, a parasitic thyristor is formed between the neighboring P-type well regions 31 and 32. That is, a vertical NPN transistor Tr1 and a lateral PNP transistor Tr2 are formed as shown in FIG. 20, where an emitter of the vertical NPN transistor Tr1 is made of the drain layer D of the charge transfer MOS transistor M2, a base of the Tr1 is made of the P-type well region 31 and a collector of the Tr1 is made of the N-type well region 20.

Also, an emitter of the lateral PNP transistor Tr2 is made of a P+ layer 42 formed in the P-type well region 32, a base of Tr2 is made of the N-type well region 20 between the P-type well regions 31 and 32 and a collector of Tr2 is made of the P-type well region 31. The parasitic NPN transistor Tr1 and the parasitic PNP transistor Tr2 compose the parasitic thyristor.

Following inequalities hold when the charge pump device shown in FIG. 19 is in a steady operation, output voltage Vout>V3>V2>V1>input voltage Vin where the input voltage Vin is normally Vdd (equal to the power supply voltage to the clock driver); V3 denotes a voltage of the source of the charge transfer MOS transistor M3; V2 denotes a voltage of the source of the charge transfer MOS transistor M2; and V1 denotes a voltage of the source of the charge transfer MOS transistor M1.

However, following inequalities hold at start-up of the charge pump device (at the beginning of the voltage boosting).

V1>V2>V3>Vout

That is, the capacitors C1, C2, C3 and C4 are sequentially charged beginning from the first stage.

Consequently, a current flows between the emitter and the base of the parasitic PNP transistor Tr2, when it turns to be V1−Vout>$V_F$. That is to say, the parasitic NPN transistor Tr2 turns on. $V_F$ refers to a turn-on voltage between the base and the emitter.

Since a collector current of the parasitic PNP transistor Tr2 makes a base current of the parasitic NPN transistor Tr1, the parasitic NPN transistor Tr1 turns on herewith, and conduction begins between the emitter and the collector of the Tr1. Then, the parasitic NPN transistor Tr1 provides the parasitic PNP transistor Tr2 with base-emitter current, while it causes a current from the output voltage Vout to the voltage V1.

As a result, the output voltage Vout is not boosted. The joint operation between the parasitic transistors Tr1 and Tr2 described above is called a latch up.

A waveform chart at the beginning of the operation of the charge pump device obtained by a simulation is shown in FIG. 21. V1 denotes a drain voltage of the charge transfer MOS transistor M2, and V2 denotes a drain voltage of the charge transfer MOS transistor M3. The NPN transistor Tr1 turns on to induce the latch up, when Vds a voltage between the source and the drain, exceeds $V_F$ (=0.7 V approximately).

SUMMARY OF THE INVENTION

This invention can solve the issues addressed above, and can provide a semiconductor device structure and its manufacturing method suitable for a charge pump device with large current capacity and high efficiency.

The latch up can be prevented and the stable operation can be realized with this invention.

Features of this invention are as follows.

The semiconductor device of this invention includes a single crystalline semiconductor substrate of a first conductivity type, a first epitaxial semiconductor layer of a second conductivity type grown on the single crystalline semiconductor substrate, a second epitaxial semiconductor layer of the second conductivity type stacked on the first epitaxial semiconductor layer, a well region of the first conductivity type formed in the second epitaxial semiconductor layer, a first buried layer of the first conductivity type abutting on a bottom of the well region of the first conductivity type, a second buried layer of the second conductivity type abutting on a bottom of the first buried layer of the first conductivity type and electrically isolating the well region of the first conductivity type from the single crystalline semiconductor substrate and an MOS transistor formed in the well region of the first conductivity type, wherein a drain layer of the MOS transistor and the well region of the first conductivity type are electrically connected.

With a configuration described above, the first buried layer of the first conductivity type reduces a resistance of the well region and robustness against latch up can be enhanced. And the well region of the first conductivity can be set at desired potential independent from the single crystalline semiconductor substrate because of the second buried layer of the second conductivity type. Herewith, a back gate bias effect on the MOS transistor can be suppressed when the drain layer of the MOS transistor and the well region of the first conductivity are electrically connected.

Furthermore, because the first and the second epitaxial semiconductor layers are stacked, an overlap of the first buried layer of the first conductivity type and the second buried layer of the second conductivity type can be reduced, a vertical distance between the source layer and the drain layer of the MOS transistor and the second buried layer of the second conductivity type can be secured, and a withstand voltage between the source and drain of the MOS transistor can be assured.

DETAILED DESCRIPTION OF THE INVENTION

Figure 1:
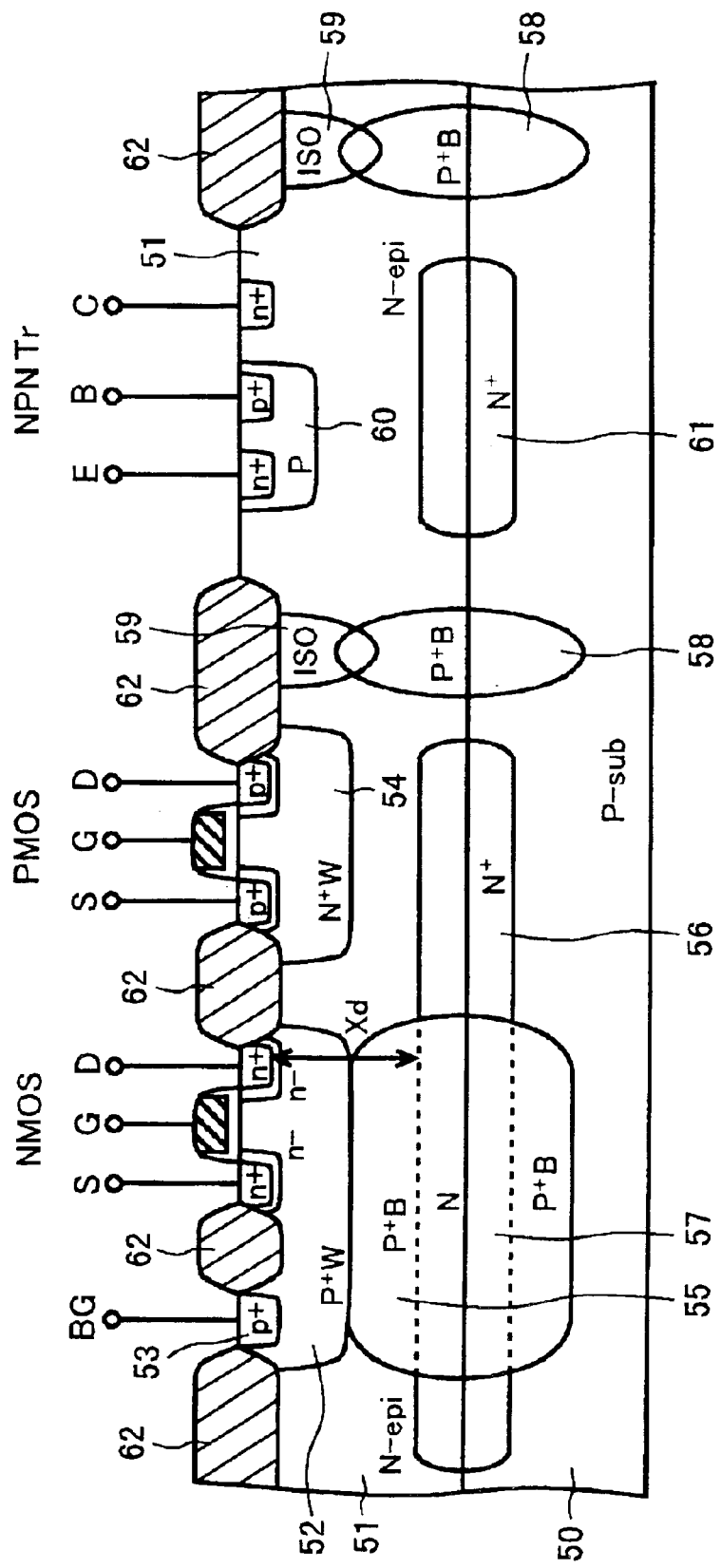
FIG. 1 shows a device structure according to a first embodiment of this invention, implemented by BiCMOS structure of this invention.

Next, a first embodiment of this invention will be explained referring to FIGS. 1–4. First, a structure of a BiCMOS device, with which a charge pump device is implemented in an integrated circuit, will be explained referring to FIG. 1.

Each of an N-channel MOS transistor (NMOS), P-channel transistor (PMOS) and an NPN bipolar transistor (NPN Tr) is formed in each of predetermined regions in an N-type epitaxial silicon layer 51, having resistivity of 1.25 Ωcm, for example, grown by vapor phase epitaxy on a P-type single crystalline silicon substrate 50.

The N-channel MOS transistor is formed in a P-type well region 52 formed in a surface of the N-type epitaxial silicon layer 51. The P-type well region 52 is, for example, about 2 μm deep. The N-channel MOS transistor has an N+-type drain layer D, an N+-type source layer S, both formed in the surface of the P-type well region 52, and a gate electrode G formed on a gate insulation film. The N-channel MOS transistor can be formed in a so-called LDD structure to reduce the size. A P+-type layer 53 to bias a body (well region) is formed adjacent the N-channel MOS transistor in the surface of the P-type well region 52.

The P-channel MOS transistor is formed in an N-type well region 54 formed in a surface of the N-type epitaxial silicon layer 51. The P-channel MOS transistor has a P+-type drain layer D, a P+-type source layer S, both formed in the N-type well region 54, and a gate electrode G formed on a gate insulation film.

A P+-type buried layer 55 is formed bordering on a bottom of the P-type well region 52 to reduce resistance of the well. The P+-type buried layer 55 is a diffusion layer formed in the same process step as a lower isolation layer 58, which will be described later, and is formed across a boundary surface between the P-type single crystalline silicon substrate 50 and the N-type epitaxial silicon layer 51.

And an N+-type buried layer 56 is formed across the boundary surface between the P-type single crystalline silicon substrate 50 and the N-type epitaxial silicon layer 51. The N+-type buried layer 56 extends from below the N-type well region 54, in which the P-channel MOS transistor is formed, to below the P-type well region 52, in which the N-channel MOS transistor is formed.

That is, the N+-type buried layer 56 partially overlaps with the P+-type buried layer 55. When impurity concentration in the N+-type buried layer 56 is higher than impurity concentration in the P+-type buried layer 55, a conductivity type of the overlapped region 57 becomes N-type as a result of compensation.

Hereby the P-type well region 52 is electrically separated from the P-type single crystalline silicon substrate 50, and can be set at a voltage independently. In a practical case, the voltage of the P-type well region 52 can be set by applying a voltage to a terminal BG connected to the P+-type layer 53 for body bias.

Herewith the back gate bias effect can be suppressed by electrically connecting the drain layer D of the N-channel MOS transistor with the P-type well region 52. For that purpose, an interconnection (aluminum interconnection, for example) is formed to connect the P-type layer 53 with the drain layer D.

Since the N-channel MOS transistor is used as a charge transfer MOS transistor in the charge pump device, current from the charge pump device can be increased by reducing ON resistance of the N-channel MOS transistor.

The N-channel MOS transistor is also used as a so-called transmission gate. The ON resistance in this case also can be reduced. Furthermore, linearity in input/output characteristics of the transmission gate can be improved.

Figure 2:
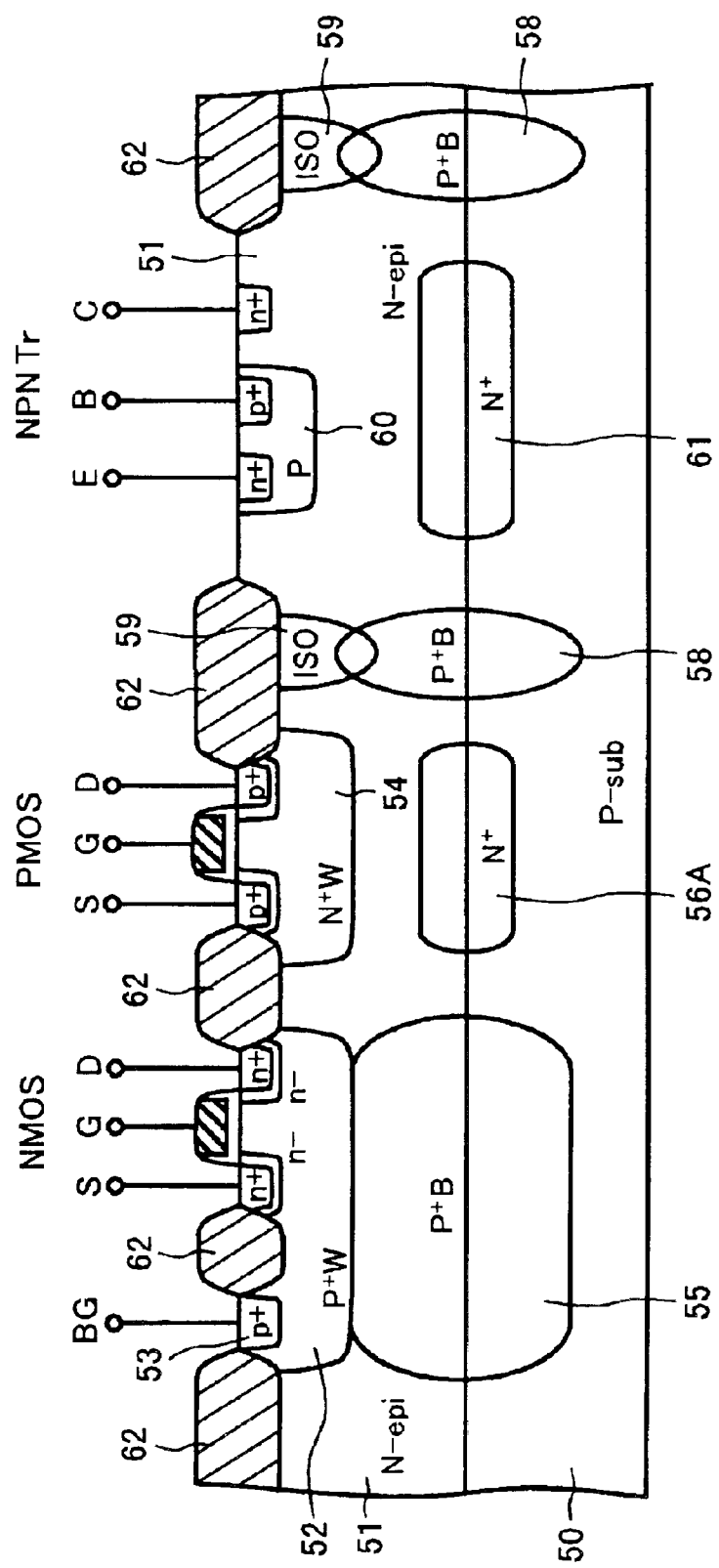
FIG. 2 shows a device structure according to the first embodiment of this invention, implemented by other BiCMOS structure of this invention.

Now, a comparison between the BiCMOS structure of this embodiment and the other BiCMOS structure is made. In the other BiCMOS structure, the N+-type buried layer 56 is formed localized below the N-type well region 54, in which the P-channel MOS transistor is formed, as shown in FIG. 2, and serve to reduce the resistance of the well.

With this structure however, the P+-type well region 52 of the N-channel MOS transistor and the P-type single crystalline silicon substrate 50 are electrically conducting through the P+-type buried layer 55. Since the P-type single crystalline silicon substrate 50 is normally set at a ground level potential, the P+-well region 52 is also set at the ground level potential.

Thus, the P+-well region 52 is made electrically separated from the P-type single crystalline silicon substrate 50 by extending the N+-type buried layer 56 to a region below the N-channel MOS transistor.

The NPN bipolar transistor (NPN Tr) is formed in the N-type epitaxial silicon layer 51, which is electrically separated from neighboring devices with the P-type lower isolation layer 58 and a P-type upper isolation layer 59. The P-type lower isolation layer 58 is formed by diffusing an impurity such as boron upward from the P-type single crystalline silicon substrate 50. On the other hand, the P-type upper isolation layer 59 is formed by diffusing an impurity such as boron downward from a top surface of the N-type epitaxial silicon layer 51. An upper portion of the P-type lower isolation layer 58 and a lower portion of the P-type upper isolation layer 59 overlap in the N-type epitaxial silicon layer 51 to form a continuous isolation layer.

Then a P-type base region 60 is formed in the surface of the N-type epitaxial silicon layer 51 which is electrically isolated. An N+-type emitter layer E and a P+-type layer B for connection to a base electrode are formed in a surface of the P-type base region 60. Also an N+-type layer C for connection to a collector electrode is formed adjacent the P-type base region 60 in the surface of the N-type epitaxial silicon layer 51. An N+-type buried layer 61 is formed across the boundary surface between the P-type single crystalline silicon substrate 50 and the N-type epitaxial silicon layer 51. The N+-type buried layer 61 is a layer to reduce a collector resistance, and is formed in the same process step as the N+-type buried layer 56.

A field oxide 62 for device isolation is formed on the surface of the N-type epitaxial silicon layer 51 excluding regions for device formation. The field oxide 62 is formed by so-called LOCOS (Local Oxidation of Silicon) method.

Figure 3:
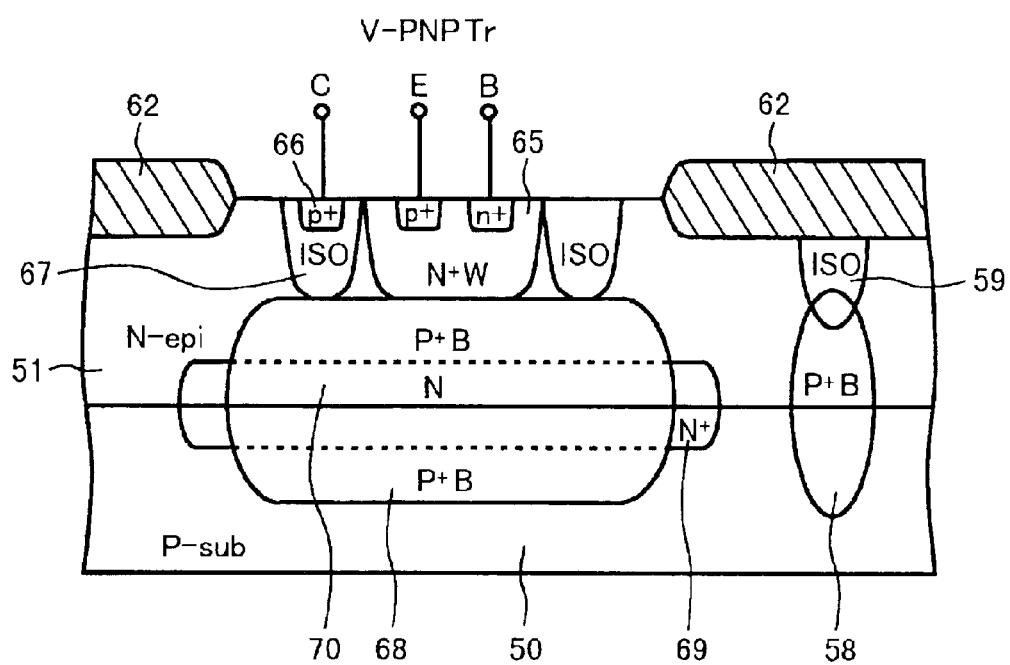
FIG. 3 is a cross-sectional view of a vertical PNP bipolar transistor according to the first embodiment of this invention.

FIG. 3 is a cross-sectional view showing the vertical PNP bipolar transistor. An N-type base region 65 is formed in the surface of the N-type epitaxial silicon layer 51. A P+-type emitter layer E and an N+-type layer B for connection to a base electrode are formed in a surface of the N-type base region 65. Also a P+-type layer 66 for connection to a collector electrode is formed adjacent the N-type base region 65 in the surface of the N-type epitaxial silicon layer 51.

And the P+-type layer 66 for connection to a collector electrode is connected with a P+-type buried layer 68 through a P-type layer 67 formed in the same process step as the P-type upper isolation layer 59. The P+-type buried layer 68 is a layer to reduce a collector resistance.

An N+-type buried layer 69 is formed to overlap with the P+-type buried layer 68. A region 70 where the P+-type buried layer 68 and the N+-type buried layer 69 overlap becomes an N-type region. Herewith the collector is electrically separated from the P-type single crystalline silicon substrate 50. The structure in which the overlapped region 70 is formed with the P+-type buried layer 68 and the N+-type buried layer 69 is the same as the structure for the N-channel MOS transistor. That is, the manufacturing process is common to both structures, thus no additional process step is required.

Figure 4:
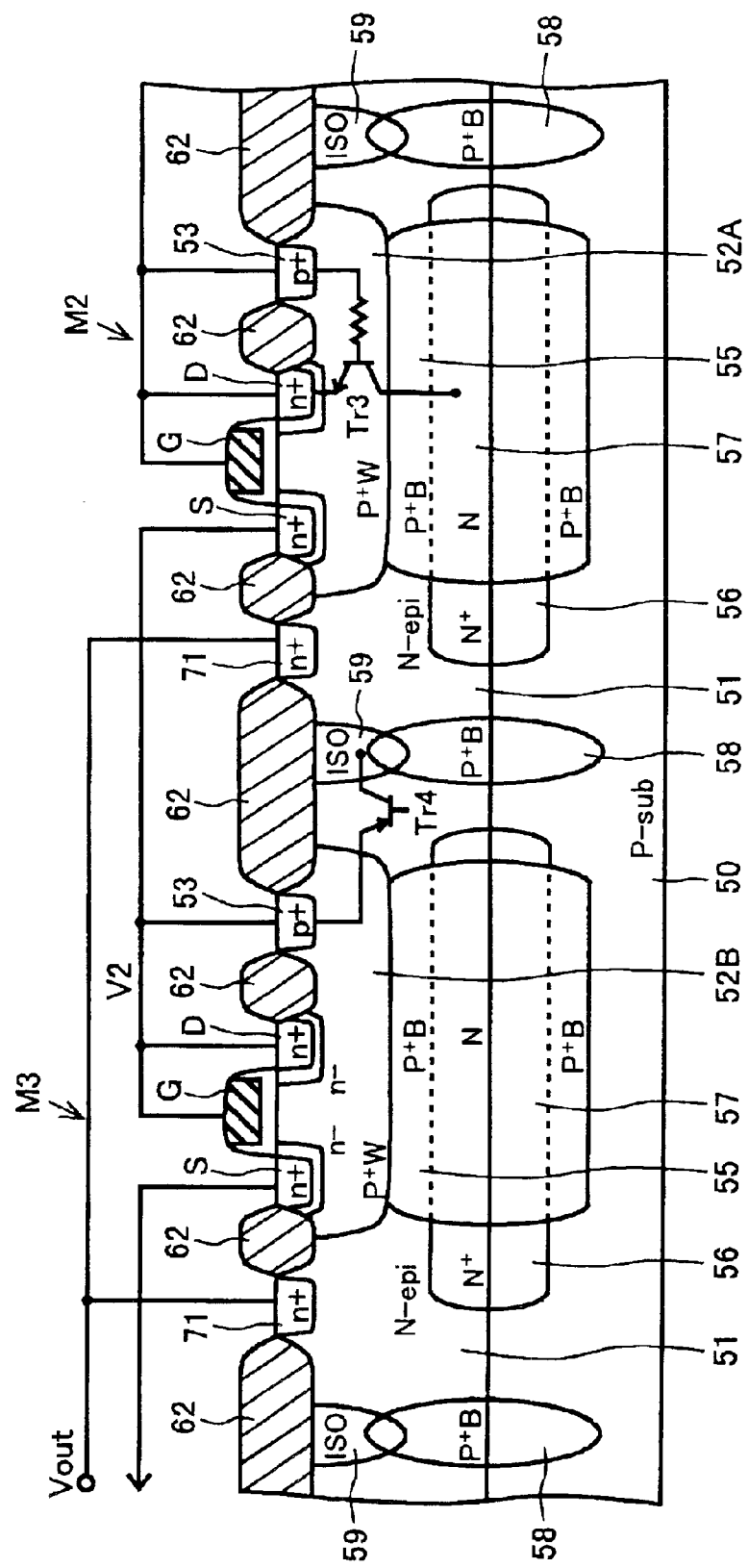
FIG. 4 is a cross-sectional view showing a charge pump device according to the first embodiment of this invention.

Next, the structure of the charge pump device will be explained referring to FIG. 4. The circuit structure of the charge pump device of FIG. 4 is the same as that shown in FIG. 19. However, the drain layer of the charge transfer MOS transistor is connected to the body (well region) in the embodiment. The same symbols as in FIG. 1 are given to constituent elements common with those in FIG. 1, and detailed explanation is omitted.

Figure 19:
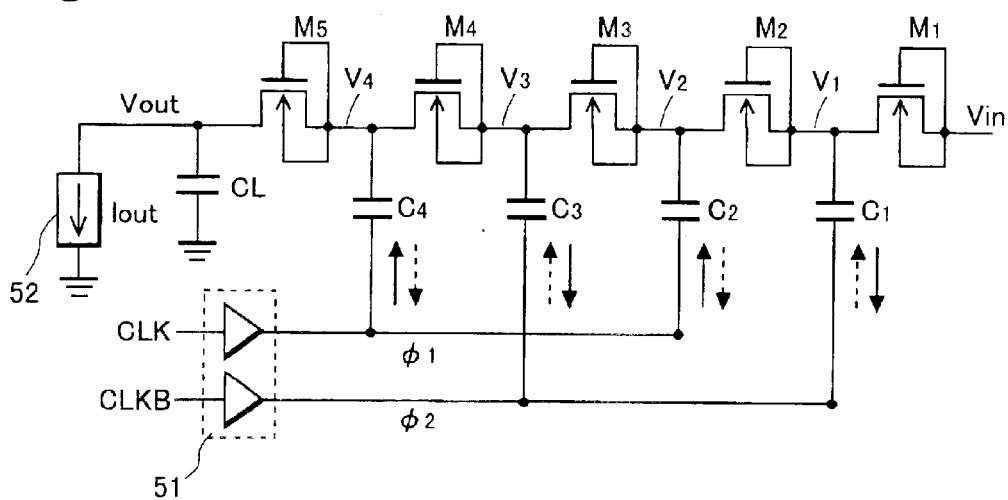
FIG. 19 is a circuit diagram of a charge pump device according to a conventional art.

The charge transfer MOS transistors M2 and M3 of the charge pump device of FIG. 19 are shown in FIG. 4. Each of P-type well regions 52A and 52B are formed in each of the N-type epitaxial silicon layers 51, which are electrically separated from each other with the P-type lower isolation layer 58 and the P-type upper isolation layer 59. And each of the charge transfer MOS transistors M2 and M3 are formed in each of the P-type well regions 52. The structures of the P+-type buried layer 55, the N+-type buried layer 56 and the overlapped region 57 are the same as the structure shown in FIG. 1.

The drain layer D of the charge transfer MOS transistor M2 is connected with the P+-type layer 53 formed in the P-type well region 52A with an aluminum interconnection, for example. Herewith, a voltage Vgb between the gate and the body of the charge transfer MOS transistor M2 is held equal to a voltage Vgd between the gate and the drain of the charge transfer MOS transistor M2, thus an increase in the threshold voltage Vth of the charge transfer MOS transistor M2 due to the back gate effect is prevented. The same applies to the charge transfer MOS transistor M3. Hereby ON resistance of the charge transfer MOS transistors M1–M5 of the charge pump device is reduced, and a charge pump device having a large current capacity can be realized.

An N+-type layer 71 for connection to an electrode is formed in the surface of the N-type epitaxial silicon layers 51 adjacent each of the P-type well regions 52A and 52B. By applying the output voltage Vout from the charge pump device to each of the N+-type layers 71, the N-type epitaxial silicon layers 51 are biased to a positive high voltage n Vdd.

n refers to the number of stages in the charge pump device, and Vdd refers to the power supply voltage of it. And the P-type single crystalline silicon substrate 50 is biased to the ground potential 0 V or a negative potential. Herewith, PN junctions formed between the P-type well regions 52A and 52B and the N-type epitaxial silicon layers 51, and PN junctions formed between the N-type epitaxial silicon layers 51 and the P-type single crystalline silicon substrate 50 are reverse-biased.

The latch up does not occur in the device structure described above. The reason for that will be explained hereinafter.

A parasitic NPN transistor Tr3 and a parasitic PNP transistor Tr4 are formed, as shown in FIG. 4. The NPN parasitic transistor Tr3 is composed of an emitter made of the drain layer D of the charge transfer MOS transistor M2, a base made of the P-type well region 52A and a collector made of the N-type overlapped region 57 (which is connected with the N-type epitaxial silicon layer 51). And the parasitic PNP transistor Tr4 is composed of an emitter made of the P-type well region 52B, a base made of the N-type epitaxial silicon layer 51 which is separated, and a collector made of the P-type lower isolation layer 58 and the P-type upper isolation layer 59 which are connected with the P-type single crystalline silicon substrate 50.

Figure 20:
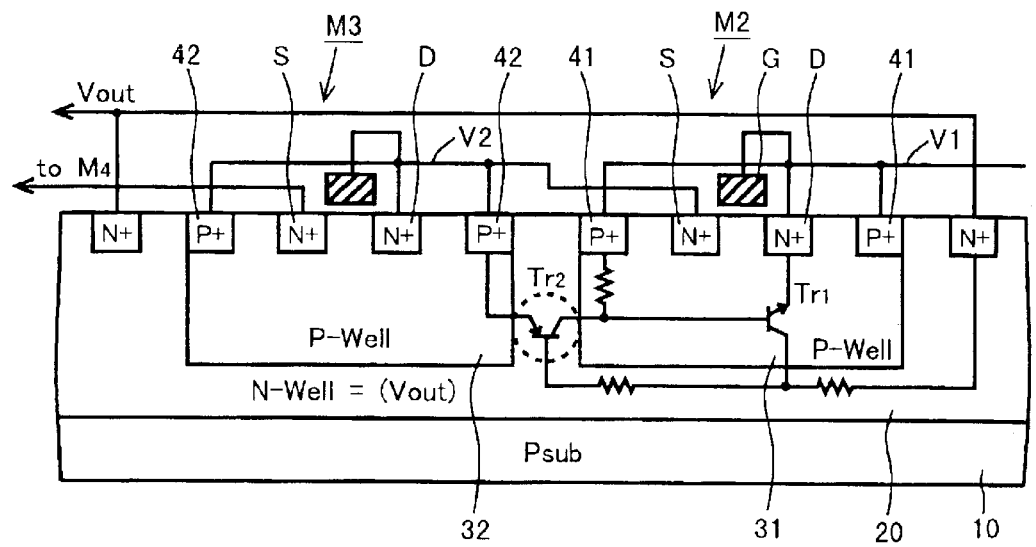
FIG. 20 is a cross-sectional view of the charge pump device implemented in CMOS structure according to the conventional art.
Figure 21:
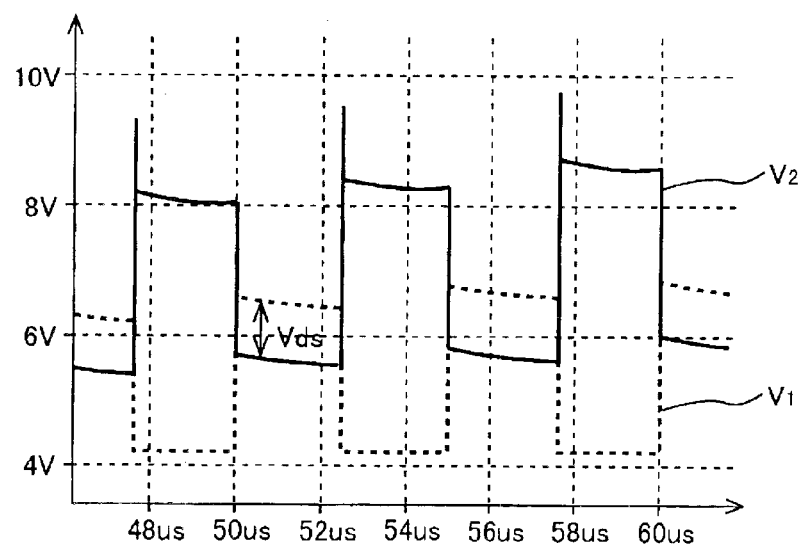
FIG. 21 is a waveform chart obtained by simulation at the beginning of the operation of the charge pump device according to the conventional art.

However, the parasitic NPN transistor Tr3 and the parasitic PNP transistor Tr4 are electrically separated by the P-type lower isolation layer 58 and the P-type upper isolation layer 59. Hence a thyristor such as one shown in FIG. 20 is not formed. Therefore, it seems that robustness against latch up is significantly enhanced.

An example in which the invention is applied to the four-stage Dickson charge pump device is explained in the embodiment described above. However, it is obvious that the number of stages is not limited to four.

Although the charge transfer MOS transistors consist of N-channel MOS transistors in the embodiment, P-channel MOS transistors can also serve as charge transfer MOS transistors by reversing polarities of the well regions and so on. For a charge pump device, which generates a negative boosted voltage, connection between the source of the charge transfer MOS transistor and the body and the timing of the clock pulses are reverse of those for the charge pump device generating positive boosted voltage.

Furthermore, this invention is not limited to the charge pump device using the charge transfer MOS transistors M1–M5, the gate and the drain of each of which are connected, but also applicable to a charge pump device using the charge transfer MOS transistors M1–M5, the gate and the drain of each of which are not connected, instead a high voltage is applied between the gate and the source of each of the charge transfer MOS transistors when they are turned on. The same effects can be obtained with it.

Figure 5:
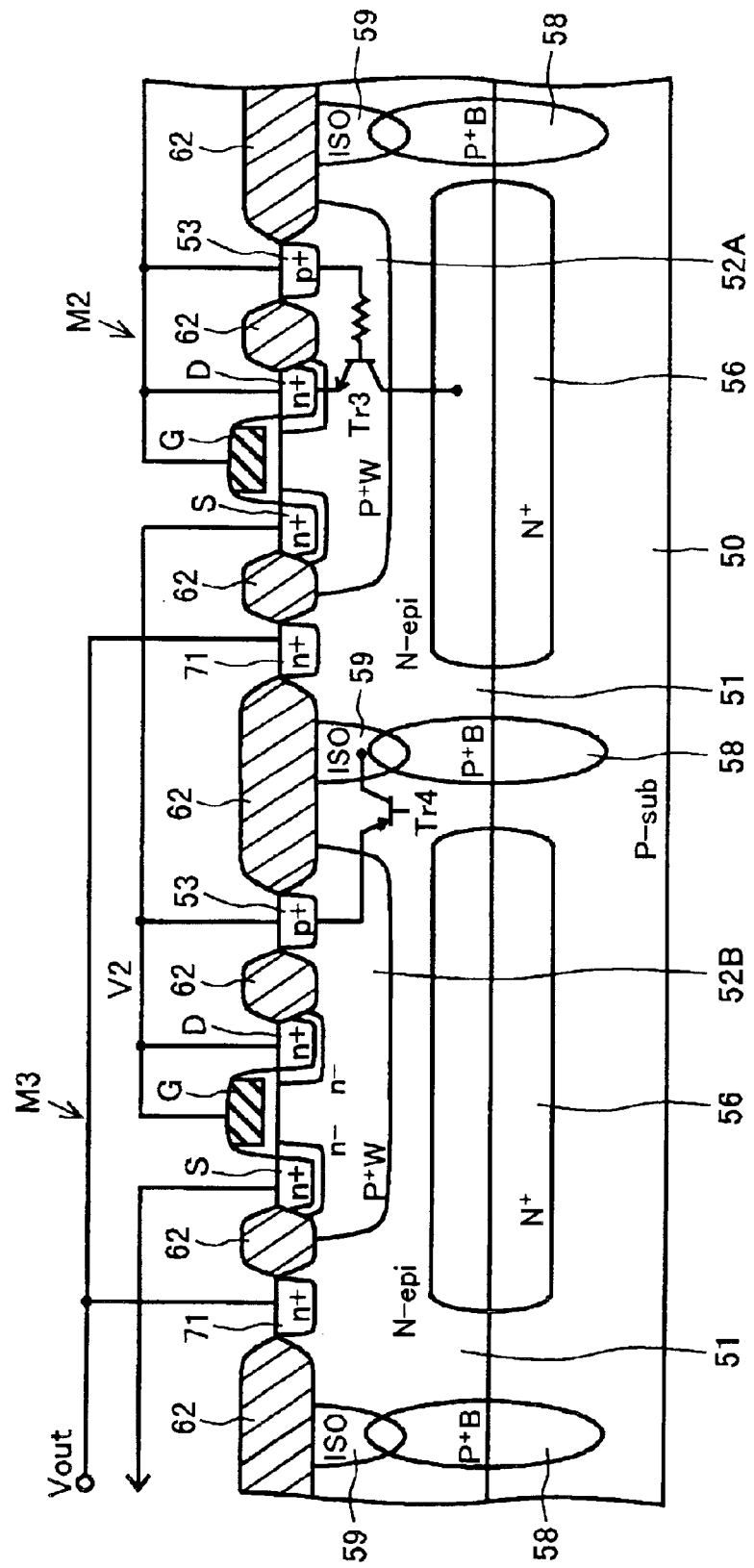
FIG. 5 is a cross-sectional view showing a charge pump device according to a second embodiment of this invention.

FIG. 5 is a cross-sectional view showing a charge pump device according to a second embodiment of this invention.

Circuit structure of this charge pump device is similar to that of the first embodiment. The charge transfer MOS transistors M2 and M3 of the charge pump device of FIG. 19 are shown in FIG. 5, as in the case of the first embodiment.

Difference from the first embodiment is that the P+-type buried layer 55 is not formed below the P-type well regions 52A and 52B. Although the effect to reduce the resistance of the P-type well regions 52A and 52B is lost because of the lack of the P+-type buried layer 55, it seems that robustness against latch up is increased compared with the conventional charge pump device by adding the lower isolation layer 58 and the upper isolation layer 59.

Figure 6:
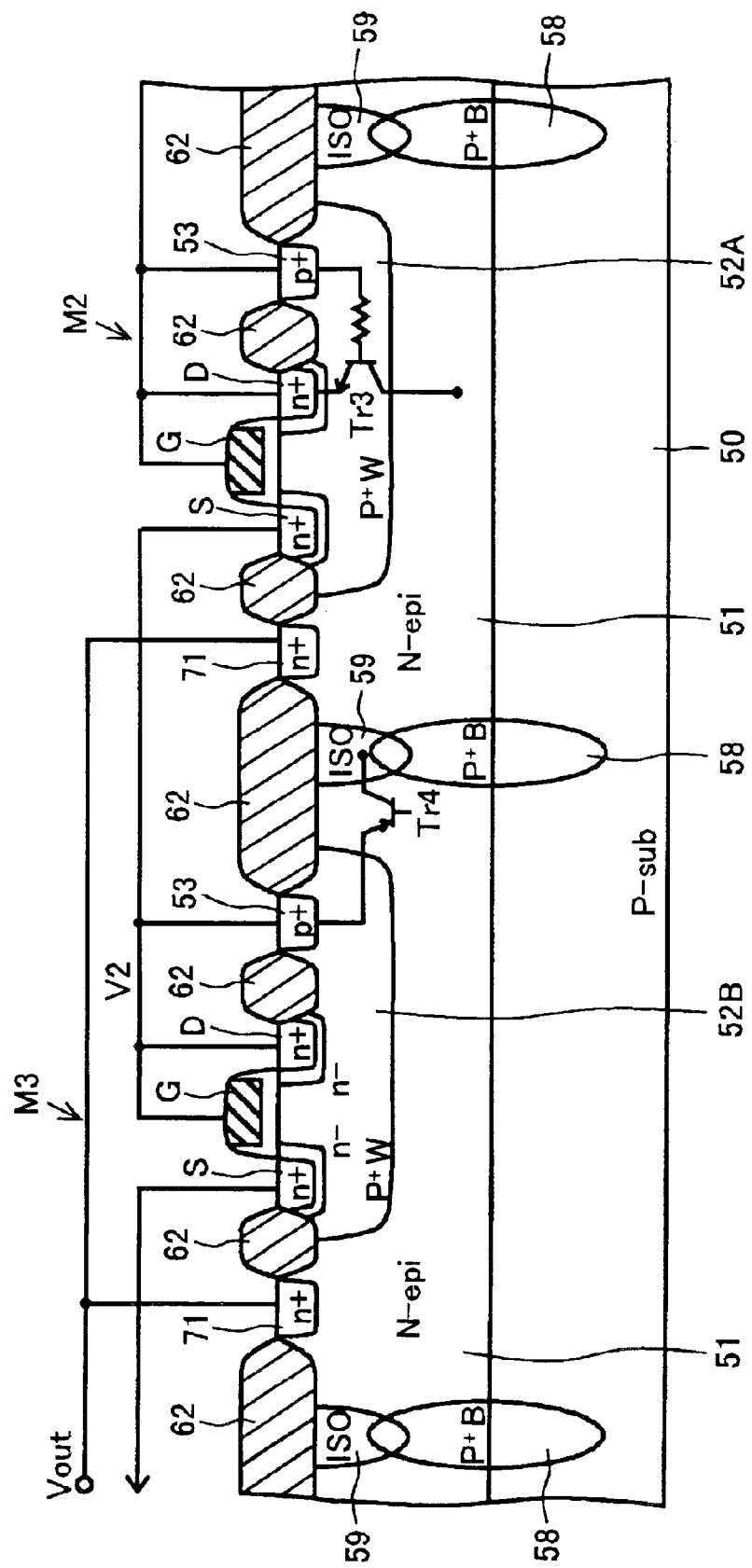
FIG. 6 is a cross-sectional view showing a charge pump device according to a third embodiment of this invention.

FIG. 6 is a cross-sectional view showing a charge pump device according to a third embodiment of this invention.

Circuit structure of this charge pump device is similar to that of the first embodiment. The charge transfer MOS transistors M2 and M3 of the charge pump device of FIG. 19 are shown in FIG. 6.

Difference from the first embodiment is that neither the N+-type buried layer 56 nor the P+-type buried layer 55 is formed below the P-type well regions 52A and 52B.

Although the effect to reduce the resistance of the N-type epitaxial silicon layers 51 is lost because of the lack of the N+-type buried layer 56, it seems that robustness against latch up is increased compared with the conventional charge pump device by adding the lower isolation layer 58 and the upper isolation layer 59.

Next, a fourth embodiment of this invention will be explained referring to FIGS. 7–17. In the charge pump device of this embodiment, a voltage from a level shift circuit is applied to a gate of a charge transfer MOS transistor to further reduce ON resistance of the charge transfer MOS transistor. Hereby a charge pump device having an even larger current capacity can be realized. However, a high voltage transistor is required for the level shift circuit to output the high voltage. Hence the high voltage transistor is added to the devices used in the first embodiment.

A circuit structure of a charge pump device including a level shift circuit will be explained, before explaining a device structure of the charge pump device of this embodiment.

Figure 7:
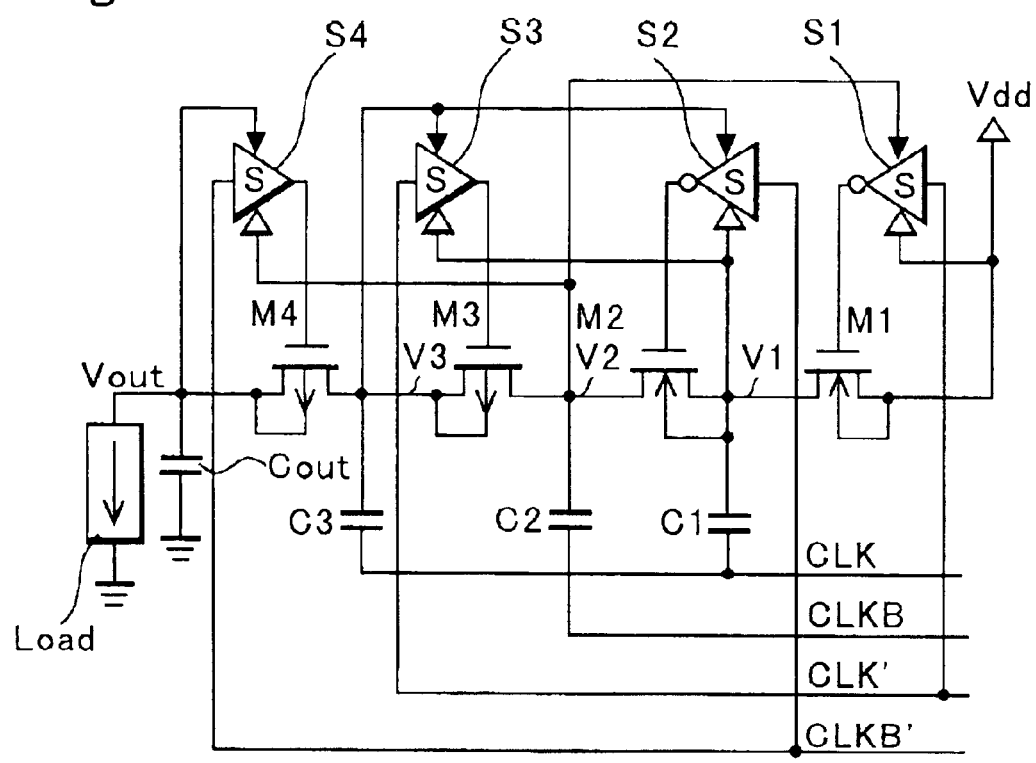
FIG. 7 is a circuit diagram of a charge pump device according to a fourth embodiment of this invention.

As seen in FIG. 7, four charge transfer MOS transistors M1–M4 are connected in series. M1 and M2 in front stages are made of N-channel transistors while M3 and M4 in rear stages are made of P-channel transistors This embodiment is different from any of the first, second and third embodiments in this point. A drain and a body of each of M1–M4 are connected to each other so that the voltage Vgb between the gate and the body is equal to the voltage Vgd between the gate and the drain to suppress a back gate effect. In this point, this embodiment is the same as the first, second and third embodiments.

The power supply voltage Vdd as an input voltage Vin is supplied to the source of M1. A boosted voltage Vout is outputted from the drain of M4, and supplied to a current load L.

C1, C2 and C3 are coupling capacitors, one end of each of which is connected to a connecting point (pumping node) between the charge transfer MOS transistors M1–M4. The other ends of the coupling capacitors C1–C3 are alternately supplied with clock pulses CLK and clock pulses CLKB in opposite phase thereto. The clock pulses CLK and CLKB are outputted from a clock driver (not shown). The power supply voltage Vdd is supplied to the clock driver.

Each of the gates of the charge transfer MOS transistors M1 and M2 is provided with each of outputs from inverting level shift circuits S1 and S2, respectively. And each of the gates of the charge transfer MOS transistors M3 and M4 is provided with each of outputs from non-inverting level shift circuits S3 and S4, respectively.

Figure 8A:
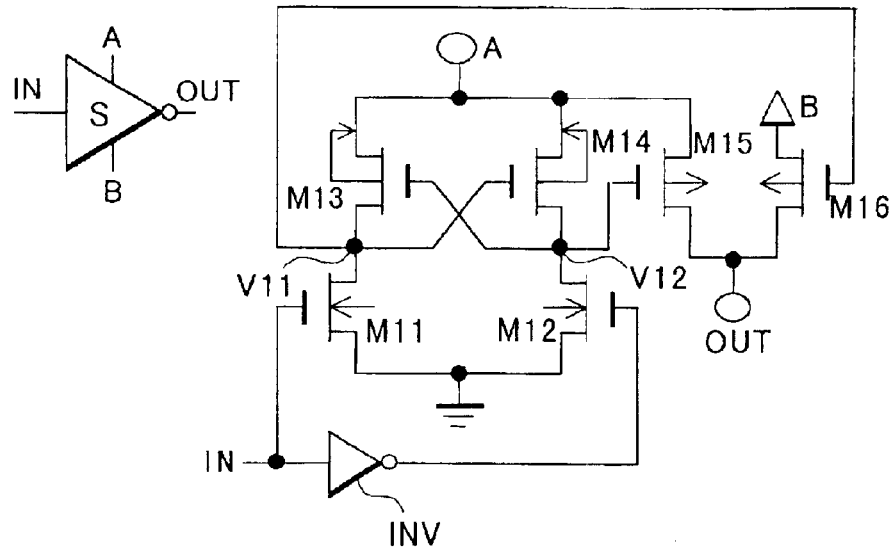
FIG. 8A and FIG. 8B are circuit diagrams of inverting level shift circuits S1 and S2 according to the fourth embodiment of this invention.
Figure 8B:
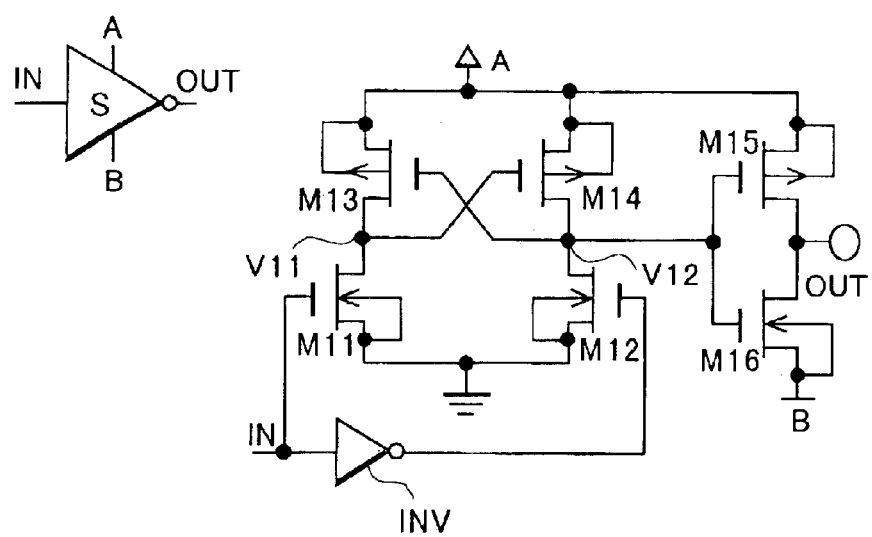
Figure 8C:
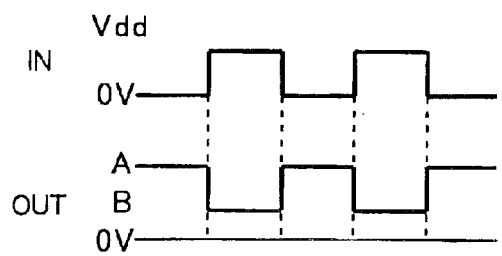
FIG. 8C is an operation waveform diagram of the inverting level shift circuits S1 and S2 according to the fourth embodiment of this invention.

The circuit diagrams of the inverting level shift circuits S1 and S2 are shown in FIGS. 8A and 8B, and an operation waveform diagram of the inverting level shift circuits S1 and S2 is shown in FIG. 8C. As seen from FIG. 8A, the inverting level shift circuit includes an input inverter INV, differential input MOS transistors M11 and M12, and MOS transistors M13 and M14 which are cross-connected. The inverting level shift circuit further includes pull-up MOS transistors M15 and M16. A gate of the pull-up MOS transistor 15 is supplied with a voltage V12, while a voltage A is applied to the source thereof.

A gate of the pull-up MOS transistor 16 is supplied with a voltage V11 in opposite phase to the voltage V12, while a voltage B is applied to the source thereof. It is assumed that electric potential A>electric potential B. M11 and M12 are N-channel high voltage transistors and M13–M16 are P-channel high voltage transistors.

As seen from FIG. 8B, the pull-up MOS transistors M15 and M16 may be modified into an inverter configuration.

The operation waveform of the inverting level shift circuits having the above configurations is shown in FIG. 8C. The level shift circuits output the voltage A and the intermediate voltage B (A>B>0 V) alternately.

Figure 9A:
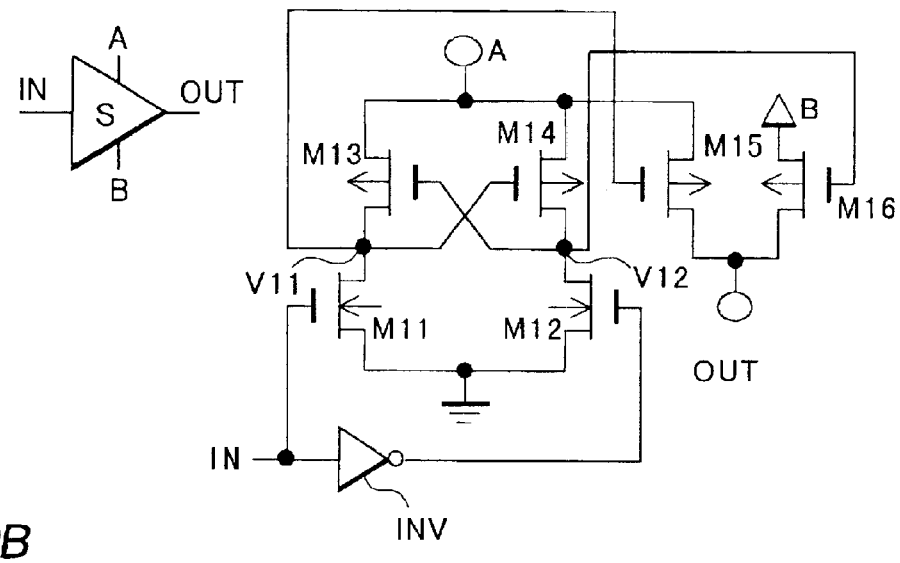
FIG. 9A and FIG. 9B are circuit diagrams of non-inverting level shift circuits S3 and S4 according to the fourth embodiment of this invention.
Figure 9B:
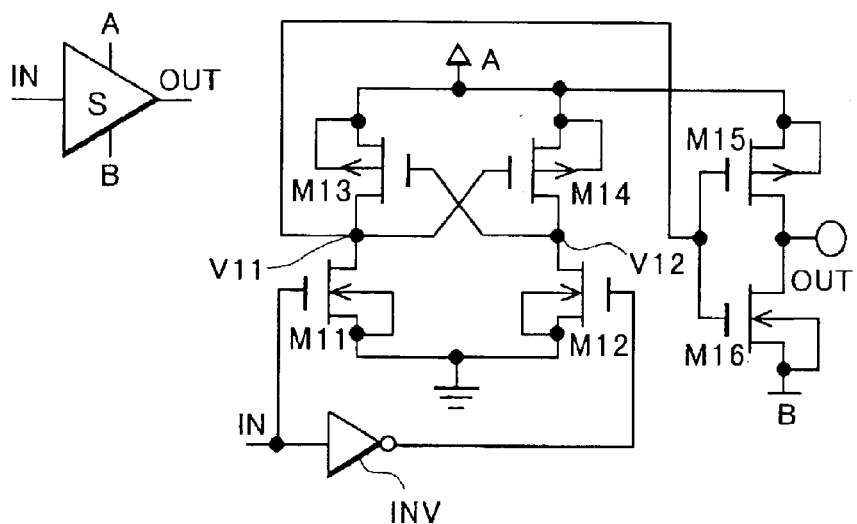
Figure 9C:
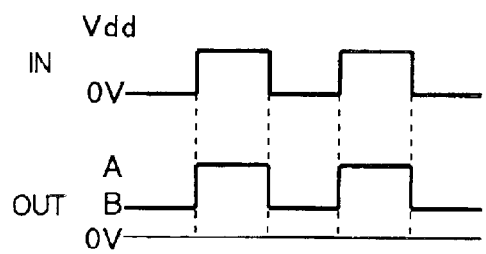
FIG. 9C is an operation waveform diagram of the non-inverting level shift circuits S3 and S4 according to the fourth embodiment of this invention.

The circuit diagrams of the non-inverting level shift circuits S3 and S4 are shown in FIGS. 9A and 9B, and an operation waveform diagram of the non-inverting level shift circuits S3 and S4 is shown in FIG. 9C. The non-inverting level shift circuit shown in FIG. 9A is different from the inverting level shift circuits S1 and S2 in that the gate of the MOS transistor M15 pulled up to the potential A is supplied with the voltage V11 and the gate of the MOS transistor M16 pulled up to the potential B is supplied with the voltage V12 (Refer to FIG. 9A). As shown in FIG. 9B, the pull-up MOS transistors M15 and M16 may be modified into an inverter configuration.

As seen from the operation waveform of FIG. 9C, the non-inverting level shift circuits S3 and S4 perform a non-inverting level shift operation for the input voltage IN.

Using the level shift circuit, as described later, permits the absolute value of the voltage between the gate and the drain of each of the charge transfer MOS transistors M3 and M4 to be unified to a prescribed voltage (2 Vdd).

The inverting level shift circuit S1 or S2 and non-inverting level shift circuit S3 or S4 are connected to the charge pump circuit as described below. A clock pulse CLK' is inputted to the inverting level shift circuit S1 while a clock pulse CLKB' is inputted to the non-inverting level shift circuit S2. The clock pulses CLK' and CLKB' are generated from the clock pulses CLK and CLKB to have shorter "Low" periods than CLK and CLKB, in order to prevent a reverse current to the charge transfer MOS transistors M1-M4.

Figure 10:
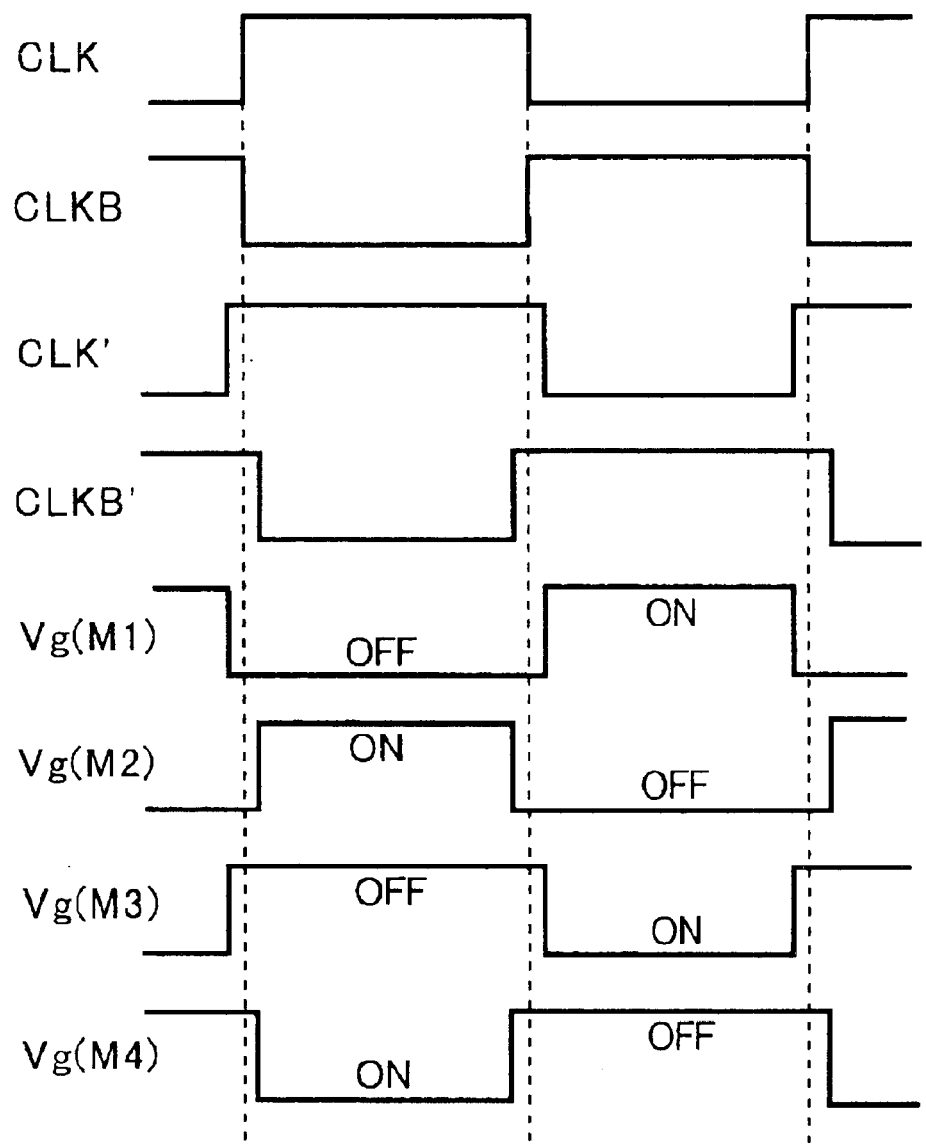
FIG. 10 is a timing chart of clock pulses and signals of the charge pump device according to the fourth embodiment of this invention.

That is, after the charge transfer MOS transistors M1–M4 are completely turned off, the voltage at each of the pumping nodes is boosted by changes in the clock pulses CLK and CLKB. The relationship among the phases of these clock pulses is shown in FIG. 10.

As shown in FIG. 7, the boosted voltage V2 at the pumping node one stage rearward is fed back and used as a high voltage side (electric potential A) of power supply to the inverting level shift circuit S1.

Similarly, the boosted voltage V3 at the pumping node one stage rearward is fed back and used as a high voltage side (electric potential A) of power supply to the inverting level shift circuit S2. As a low voltage side (electric potential B) of power supply, each of the voltages Vdd and V1 at the respective stage is applied to each of the inverting level shift circuits S1 and S2, respectively.

On the other hand, the voltage V1 at the pumping node one stage frontward is used as a low voltage side (electric potential B) of the power supply to the non-inverting level shift circuit S3, and the voltage V2 at the pumping node one stage frontward is used as a low voltage side (electric potential B) of the power supply to the non-inverting level shift circuit S4. As a high voltage side (electric potential A) of power supply, each of the voltages V3 and Vout at the respective stage is applied to each of the non-inverting level shift circuits S3 and S4, respectively.

In the above configuration, the voltage Vgd between the gate and the drain of each of the charge transfer MOS transistors M1–M4 (when they are in ON state) can be unified to 2 Vdd, as described below. First, following equations hold.

$$Vgd\ (M1) = V2\ (High) - Vdd$$

$$Vgd\ (M2) = V3\ (High) - V1\ (High)$$

$$Vgd\ (M3) = V1\ (Low) - V3\ (Low)$$

$$Vgd\ (M4) = V2\ (Low) - Vout$$

Next, as a result of the boosting operation of the charge pump in the steady state, the following equations hold.

$$V1\ (high) = 2Vdd,\ V1\ (Low) = Vdd$$

$$V2\ (high) = 3Vdd,\ V2\ (Low) = 2Vdd$$

$$V3\ (high) = 4Vdd,\ V3\ (Low) = 3Vdd,\ Vout = 4Vdd$$

It is derived from these equations that the absolute values of Vgd of all the charge transfer MOS transistors when they are ON state can be unified to the same value 2 Vdd, as shown in Table 1. For this reason, the ON resistance of the charge transfer MOS transistors M1–M4 is reduced owing to the high Vgd, so that the charge pump with high efficiency and large output current capacity can be realized. Further, since the thickness of the gate oxide of the charge transfer MOS transistors M1–M4 can be designed uniformly to withstand 2 Vdd, the MOS charge transfer transistors M1–M4 can be designed to have lower ON resistance than in the case where the voltage Vgd of the charge transfer MOS transistors is not uniform.

TABLE 1

Voltage Vgd between gate and drain of the charge transfer MOS transistors

| MOSFET | M1 | M2 | M3 | M4 |
|---|---|---|---|---|
| Vgd | 2 Vdd | 2 Vdd | −2 Vdd | −2 Vdd |

FIG. 10 is a timing chart showing the operation of the charge-pump circuit. The charge transfer MOS transistors M1–M4 repeatedly turn on and off in response to the clock pulses. Now, the clock pulses CLK' and CLKB', which are applied to the inverting level shift circuits S1 and S2 and non-inverting level shift circuits S3 and S4, have duties different from 50%. Namely the period of "Low" is set to be shorter than the period of "High", as shown in FIG. 10. Therefore, the ON period of the charge transfer MOS transistors M1–M4 becomes shorter than the OFF period. The purpose is as follows.

Since the charge transfer MOS transistors M1–M4 are not diode-connected, a reverse current may flow through them to deteriorate the power efficiency. In order to suppress the reverse current, the ON period of the charge transfer MOS transistors M1–M4 is shortened, and the clock pulses CLK and CLKB applied to the coupling capacitors are alternated to make pumping while M1–M4 are OFF.

Figure 11:
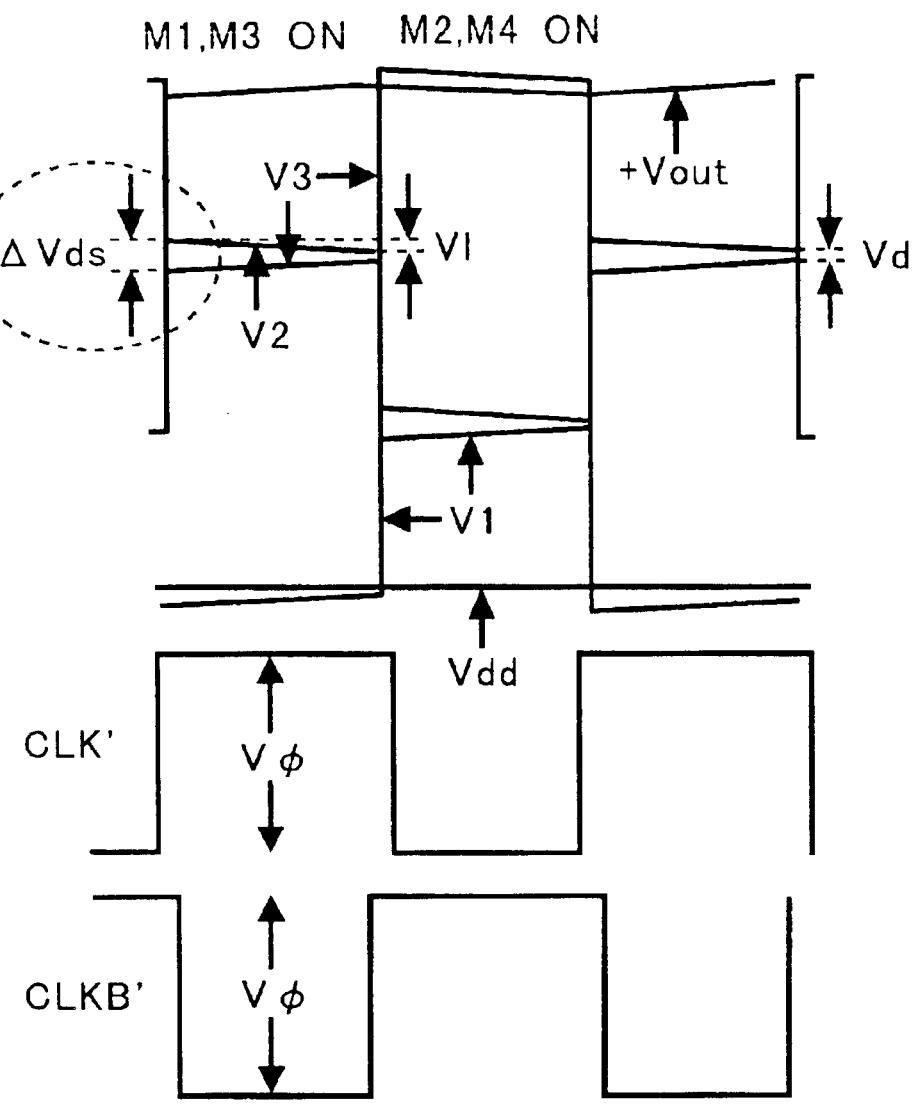
FIG. 11 is a timing chart showing waveforms of voltages V1, V2 and V3 at pumping nodes in the charge pump device according to the fourth embodiment of this invention.

FIG. 11 shows voltage waveforms V1, V2 and V3 at the respective pumping nodes. $V_\phi$ denotes the amplitude of the clock pulse CLK' and CLKB', and Δ Vds denotes a voltage between the drain and the source of the MOS transistor.

Figure 12:
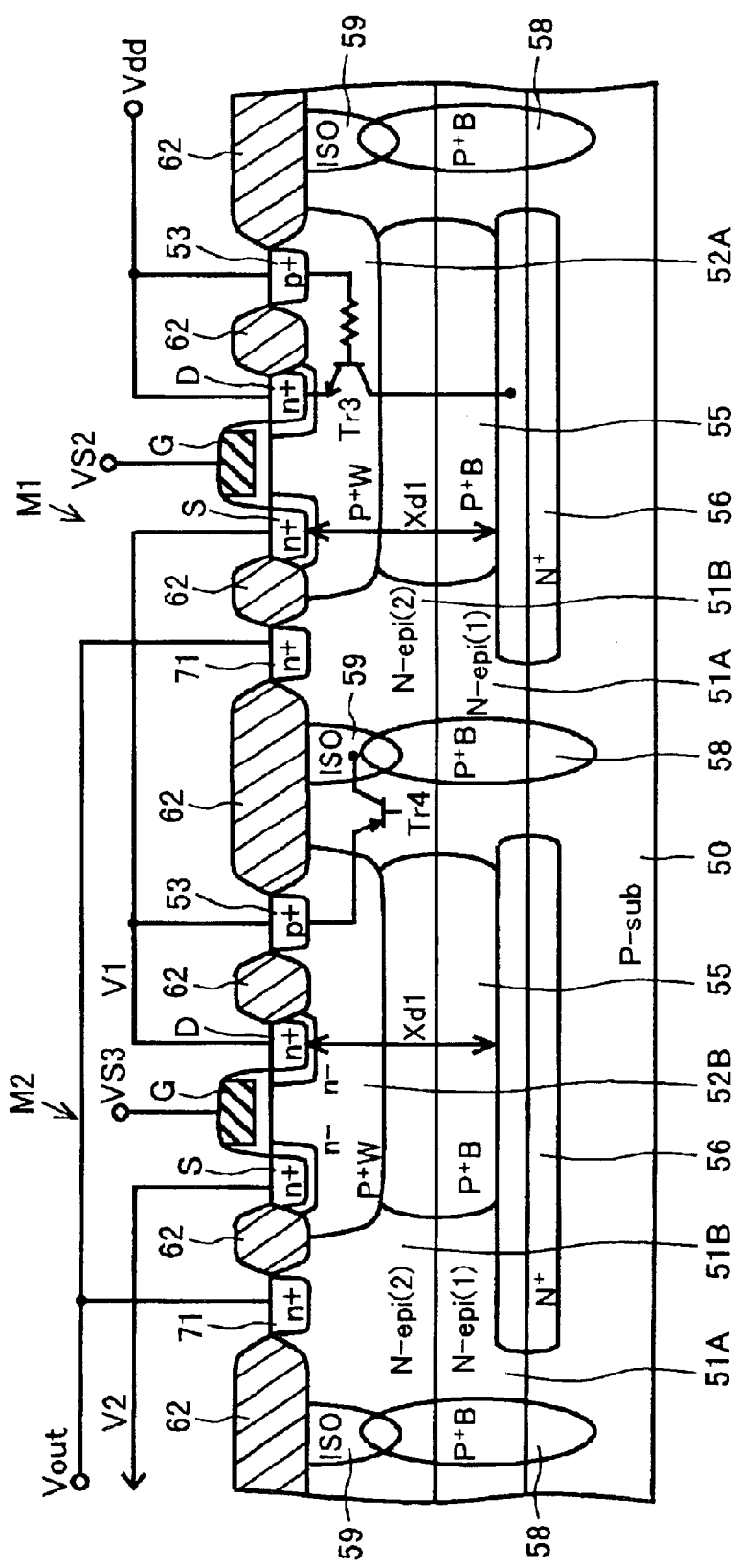
FIG. 12 is a cross-sectional view showing a structure of charge transfer MOS transistors M1 and M2 of the charge pump device according to the fourth embodiment of this invention.
Figure 13:
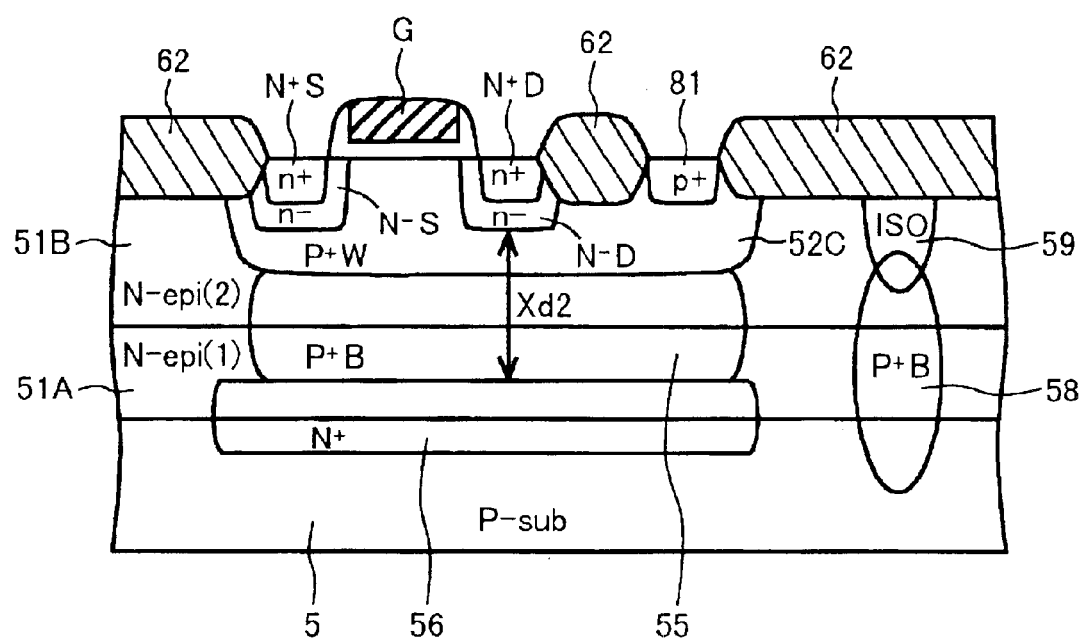
FIG. 13 is a cross-sectional view showing a structure of N-channel high voltage MOS transistors M11 and M12 used in the charge pump device according to the fourth embodiment of this invention.

A device structure of the charge pump device described above will be explained referring to FIG. 12 and FIG. 13. FIG. 12 is a cross-sectional view showing structures of the charge transfer MOS transistors M1 and M2 of the charge pump device shown in FIG. 7. And FIG. 13 is a cross-sectional view showing structures of the N-channel high voltage MOS transistors M11 and M12 used in the inverting level shift circuit S1 and S2 shown in FIGS. 8A and 8B and the non-inverting level shift circuits S3 and S4 shown in FIGS. 9A and 9B.

The N+-type buried layer 56 overlaps the P+-type buried layer 55 in the first embodiment as described before (Refer to FIG. 1 and FIG. 4). Thereby, a withstand voltage of the N-channel MOS transistor is determined by a withstand voltage between the drain layer D (or the source layer S) and the N+-type buried layer 56, when a withstand voltage between the source and the drain of the N-channel MOS transistor exceeds a certain level. This is because the depletion layer from the drain layer D (or the source layer S) reaches to the N+-type buried layer 56.

Especially for the high voltage MOS transistor used in the level shift circuit, which is required a high source-drain withstand voltage of 20 V for example, it is difficult to realize the required withstand voltage because the withstand voltage is determined by the withstand voltage between the drain layer D (or the source layer S) and the N+-type buried layer 56.

With this being the situation, it is conceivable to form the N-type epitaxial silicon layer 51 thicker in order to increase the distance Xd (Refer to FIG. 1) between the drain layer D (or the source layer S) and the N+-type buried layer 56. However, the effect of the P+-type buried layer 55, i.e., to reduce the resistance of the well region and to enhance robustness against the latch up is lost, since the P-type well region 52B and the P+-type buried layer 55 are separated.

Therefore, the N-type epitaxial silicon layer 51 is modified to a stacked double layer structure (hereafter referred to as a double epitaxial silicon layer structure). The first N-type epitaxial silicon layer 51A is grown by vapor phase epitaxy, after N-type impurity (antimony of arsenic) is introduced by ion-implantation, for example, into a region in the P-type single crystalline silicon substrate, where the N+-type buried layer 56 is to be formed. After that, a P-type impurity such as boron is introduced, for example by ion-implantation, into a regions where the P+-type buried layer 55 and the lower isolation layer 58 are to be formed, and then the second N-type epitaxial silicon layer 51B is grown by vapor phase epitaxy.

The P-type and the N-type impurities are diffused during the vapor phase epitaxy process, but a prescribed diffusion process may be added. After that, P-type well regions 52A, 52B and 52C are formed by introducing impurities from the surface of the second N-type epitaxial silicon layer 51B by ion-implantation or thermal diffusion. The upper isolation layer 59, which is to form a continuous isolation layer together with the lower isolation layer 58, is formed similarly.

Herewith as shown in FIG. 12, as for the regions where the charge transfer MOS transistors M1 and M2 are to be formed, the P-type well regions 52A and 52B are formed in the second N-type epitaxial silicon layer 51B and the P+-type buried layer 55 is formed bordering on the bottoms of the P-type well regions 52A and 52B. The P+-type buried layer 55 is formed across the boundary of the first N-type epitaxial silicon layer 51A and the second N-type epitaxial silicon layer 51B, and the N+-type buried layer 56 is formed under the P+-type buried layer 55 abutting on it.

The overlapped region of the P+-type buried layer 55 and the N+-type buried layer 56 is made narrower by adopting the double epitaxial structure, and as a result, the P+-type buried layer 55 is widely extended both upward and downward. On this account the distance Xd1 between the drain layers D (or the source layers S) of the charge transfer MOS transistors M1 and M2 and the N+-type buried layers 56 can be extended to secure the withstand voltage between the source and the drain.

The high voltage MOS transistor is formed similarly as shown in FIG. 13.

That is, the P-type well region 52C is formed in the second N-type epitaxial silicon layer 51B and the P+-type buried layer 55 is formed under the P-type well region 52C abutting on it. The P+-type buried layer 55 is formed across the boundary of the first N-type epitaxial silicon layer 51A and the second N-type epitaxial silicon layer 51B, and the N+-type buried layer 56 is formed under the P+-type buried layer 55 abutting on it.

Then the high voltage MOS transistor is formed in the P-type well region 52C.

The high voltage MOS transistor has a source layer N+S of high impurity concentration, a drain layer N+D of high impurity concentration, a deep source layer N–S of low impurity concentration, a deep drain layer N–D of low impurity concentration and a gate electrode G formed on a gate insulation film.

The overlapped region of the P+-type buried layer 55 and the N+-type buried layer 56 is made narrower by adopting the double epitaxial structure, and as a result, the P+-type buried layer 55 is widely extended both upward and downward. On this account, the distance Xd2 between the drain layer (or the source layer) of the high voltage MOS transistor and the N+-type buried layer 56 can be extended to secure the withstand voltage between the source and the drain.

FIG. 14A through FIG. 16B are cross-sectional views showing a manufacturing method of the double epitaxial silicon layer structure. Although the manufacturing method can be applied to both the high voltage MOS transistor shown in FIG. 13 and the charge transfer MOS transistor shown in FIG. 12, the explanation is given on the high voltage MOS transistor shown in FIG. 13.

Figure 14A:
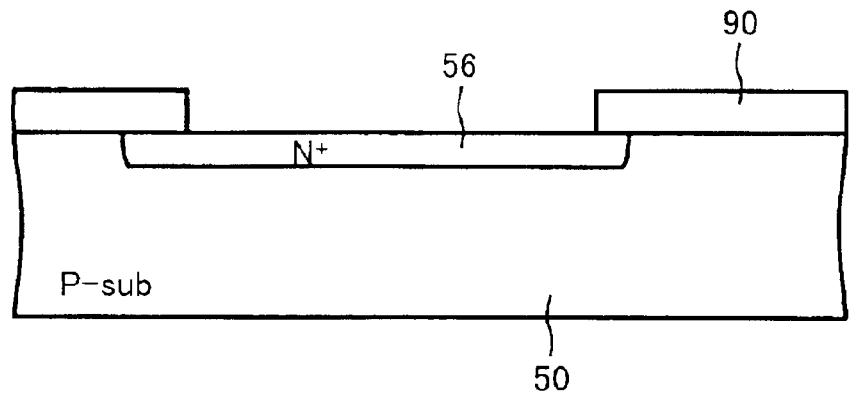
FIG. 14A, FIG. 14B and FIG. 14C are cross-sectional views showing a manufacturing method of a double epitaxial silicon layer structure.

First, as shown in FIG. 14A, an N-type impurity such as antimony or arsenic is selectively diffused into the surface of the P-type single crystalline silicon substrate 50 using an oxide film 90 as a mask. An N+-type layer 56 is formed with this. Its sheet resistance is about 30 Ω/square.

Figure 14B:
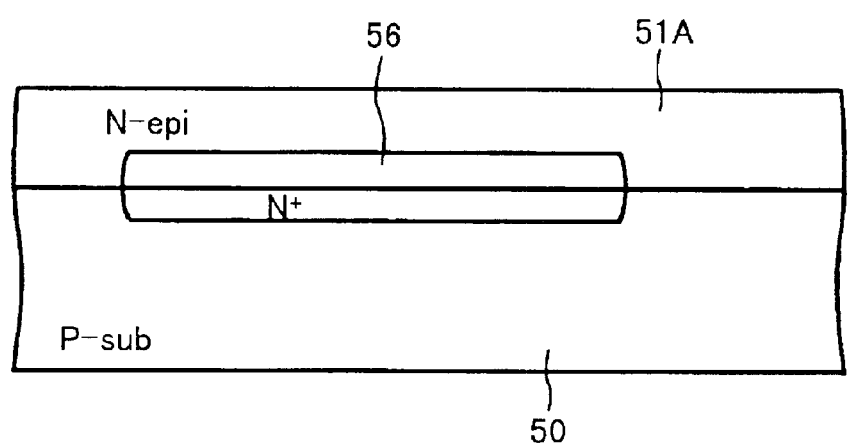

Then the first N-type epitaxial silicon layer 51A is formed by vapor phase epitaxy, as sown in FIG. 14B. Its thickness is about 1–3 μm and its resistivity is about 1–2 Ωcm, preferably. The N+-type layer 56 is also diffused into the first N-type epitaxial silicon layer 51A to form the N+-type buried layer 56.

Figure 14C:
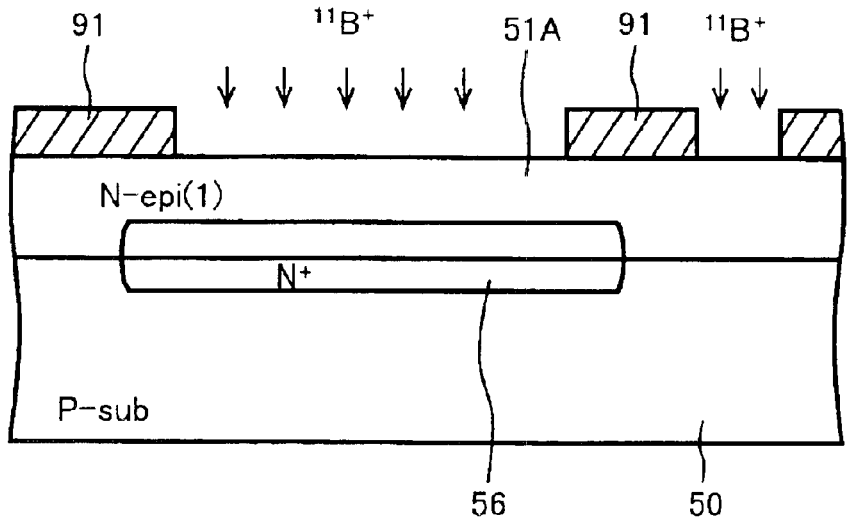

Next as shown in FIG. 14C, a photoresist layer 91 is formed on the first N-type epitaxial silicon layer 51A and a P-type impurity, for example boron, is ion-implanted into regions to form the P+-type buried layer 55 and P-type lower isolation layer 58. The acceleration voltage is 160 KeV and the amount of the dose is $1 \times 10^{14}/cm^2$ approximately. After that, a thermal diffusion at 1000° C. for about one hour is performed.

Figure 15A:
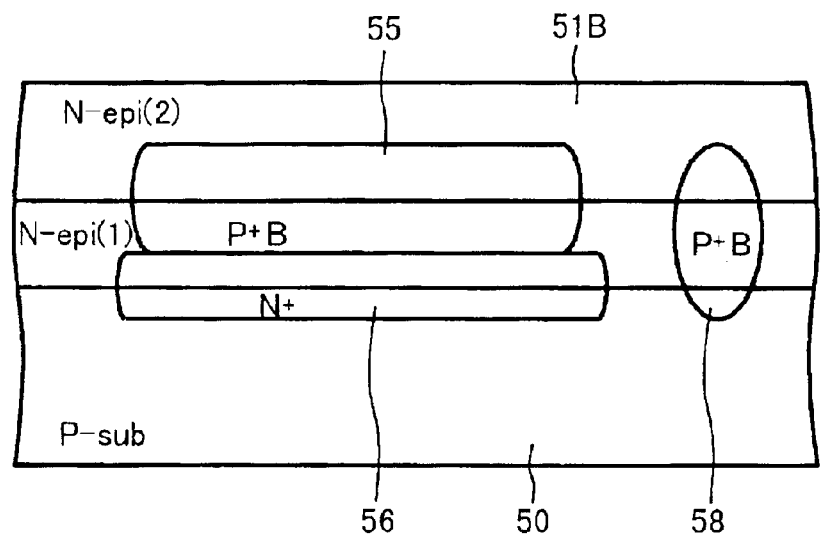
FIG. 15A and FIG. 15B are cross-sectional views showing the manufacturing method of the double epitaxial silicon layer structure.

Next, the second N-type epitaxial silicon layer 51B is formed by vapor phase epitaxy on the first N-type epitaxial silicon layer 51A, as shown in FIG. 15A. Its thickness is about 2–4 μm and its resistivity is about 1–2 Ωcm, preferably Herewith the P+-type buried layer 55 is formed across the boundary of the first N-type epitaxial silicon layer 51A and the second N-type epitaxial silicon layer 51B. The P-type lower isolation layer 58 is formed at the same time.

Figure 15B:
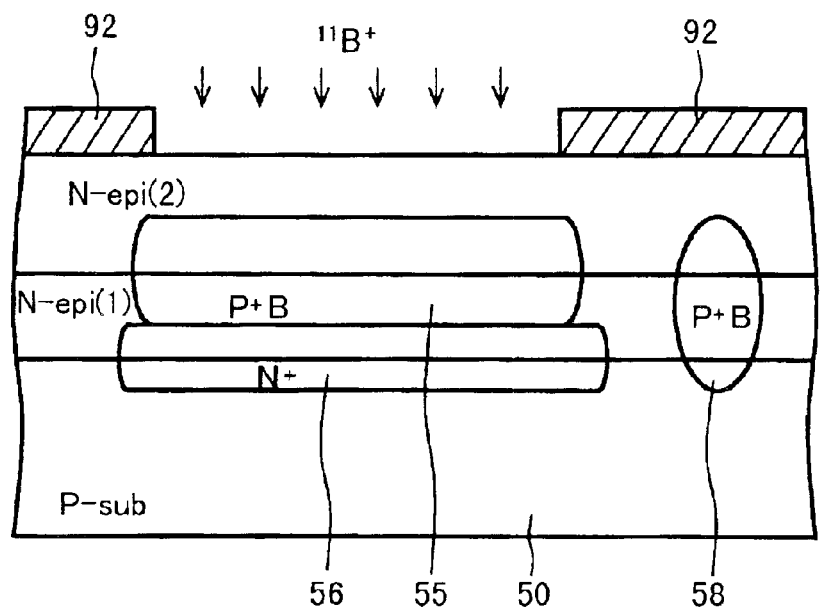

Next as shown in FIG. 15B, a photoresist layer 92 is formed on the second N-type epitaxial silicon layer 51B, and a P-type impurity, for example boron, is ion-implanted into a region to form the P-type well region 52, using the photoresist layer 92 as a mask. The acceleration voltage is 40 KeV and the amount of the dose is $3 \times 10^{14}/cm^2$. Then the photoresist layer 92 is removed and a thermal diffusion at 1100° C. for about one hour is performed to form the P-type well region 52C in the second N-type epitaxial silicon layer 51B.

Figure 16A:
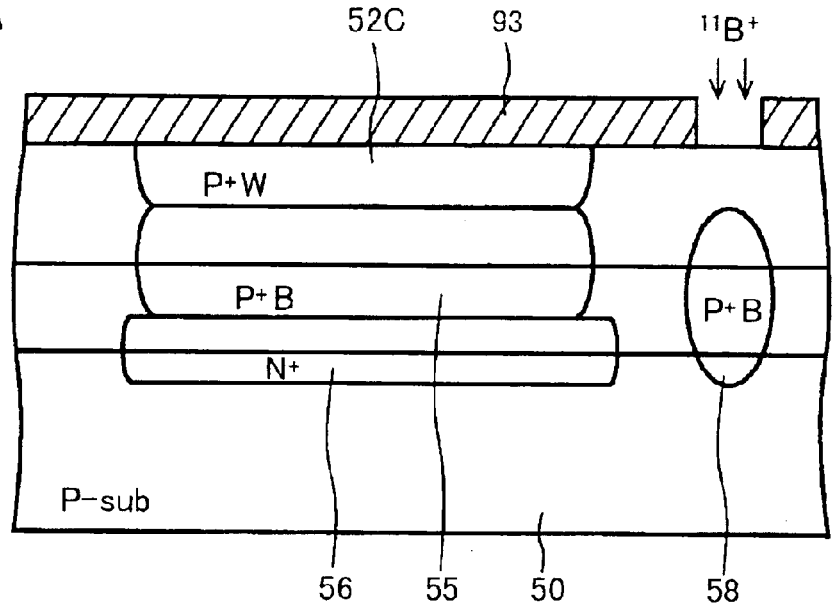
FIG. 16A and FIG. 16B are cross-sectional views showing the manufacturing method of the double epitaxial silicon layer structure.
Figure 16B:
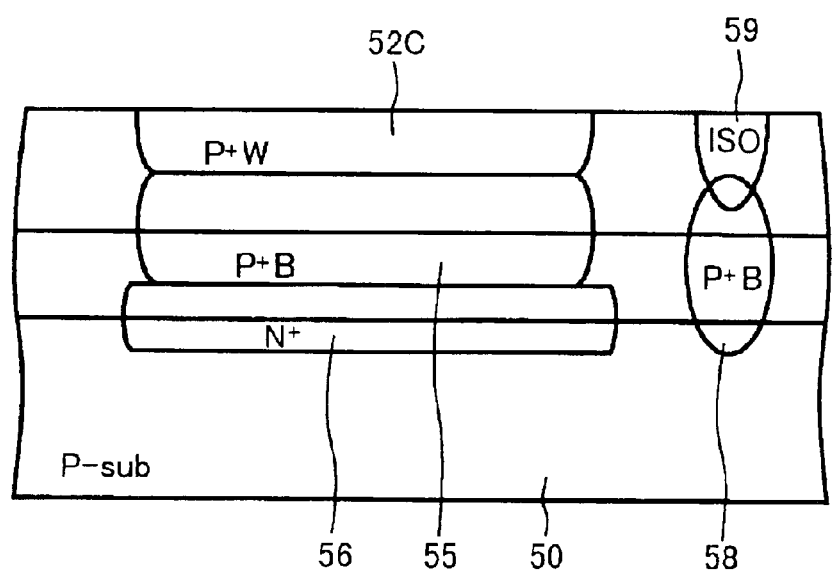

Next as shown in FIG. 16A, a photoresist layer 93 is formed on the second N-type epitaxial silicon layer 51B, and a P-type impurity, for example boron, is ion-implanted into a region to make the P-type upper isolation layer 59, using the photoresist layer 93 as a mask. The acceleration voltage is 40 KeV and the amount of the dose is $1 \times 10^{14}/cm^2$. Then the photoresist layer 93 is removed and a thermal diffusion at 1100° C. for about one hour is performed to form the P-type upper isolation layer 59, as shown in FIG. 16B. The P-type upper isolation layer 59 and the lower isolation layer 58 make a continuous isolation layer.

As described above, the overlapped region of the P+-type buried layer 55 and the N+-type buried layer 56 is made narrower by adopting the double epitaxial structure, and as a result, the P+-type buried layer 55 is widely extended both upward and downward. In other words, it is made possible to form the deeper P-type well region 52. A deep well is advantageous for high withstand voltage. That is, the distance between the drain layer (or the source layer) of the high voltage MOS transistor and the N+-type buried layer 56 can be extended to increase the withstand voltage between the source and the drain.

And now, forming the drain layer N–D of low impurity concentration deeper than the drain layer N+D of high impurity concentration and forming the source layer N–S of low impurity concentration deeper than the source layer N+S of high impurity concentration would increase the withstand voltage between the source and the drain. This is to extend the depletion layer and relax the concentration of the electric field.

In this case also, since the distance Xd2 between the drain layer (or the source layer) of the low voltage MOS transistor and the N+-type buried layer 56 is extended by adopting the double epitaxial structure, it is prevented that the withstand voltage is determined by a withstand voltage between the drain layer N–D (or the source layer N–S) of low impurity concentration and the N+-type buried layer 56. That is to say, further increasing the withstand voltage is possible without sacrificing the robustness against the latch up.

As for the relationship between the target withstand voltage and the epitaxial layers, when the withstand voltage of 20V is targeted, the thickness of the first N-type epitaxial silicon layer 51A is 2 μm, and when the withstand voltage of 30V is targeted, the thickness of the first N-type epitaxial silicon layer 51A is 3 μm. In this case, the thickness of the second N-type epitaxial silicon layer 51B is assumed to be 3.5 μm.

The double epitaxial layer structure described above has additional effect to form the deep P-type well region with less amount of thermal diffusion. That is, since the P-type well regions 52A, 52B and 52C are formed continuous to the P+-type buried layer 55, the effective depth of the P-type well regions can be regarded as the depth of the P+-type buried layer 55.

For example, a P-type well region in CMOS structure is formed by diffusing impurity such as boron from the surface of the substrate into the interior of the substrate, but it requires many hours of diffusion at high temperature to form a deep well.

With the double epitaxial structure on the contrary, the amount of thermal treatment can be significantly reduced, since the P+-type buried layer 55 is diffused from the first N-type epitaxial silicon layer 51A into the second N-type epitaxial silicon layer 51B and the P-type well region 52A is diffused downward from the surface of the second N-type epitaxial silicon layer 51B.

For example, in order to form a well having the same depth, the double epitaxial structure requires only 1100° C. as described above, while the conventional CMOS technology needs 1200° C. Hence lateral diffusion of the P-type well regions 52A, 52B and 52C is suppressed and the pattern area for the charge pump device can be reduced as a result.

Figure 17:
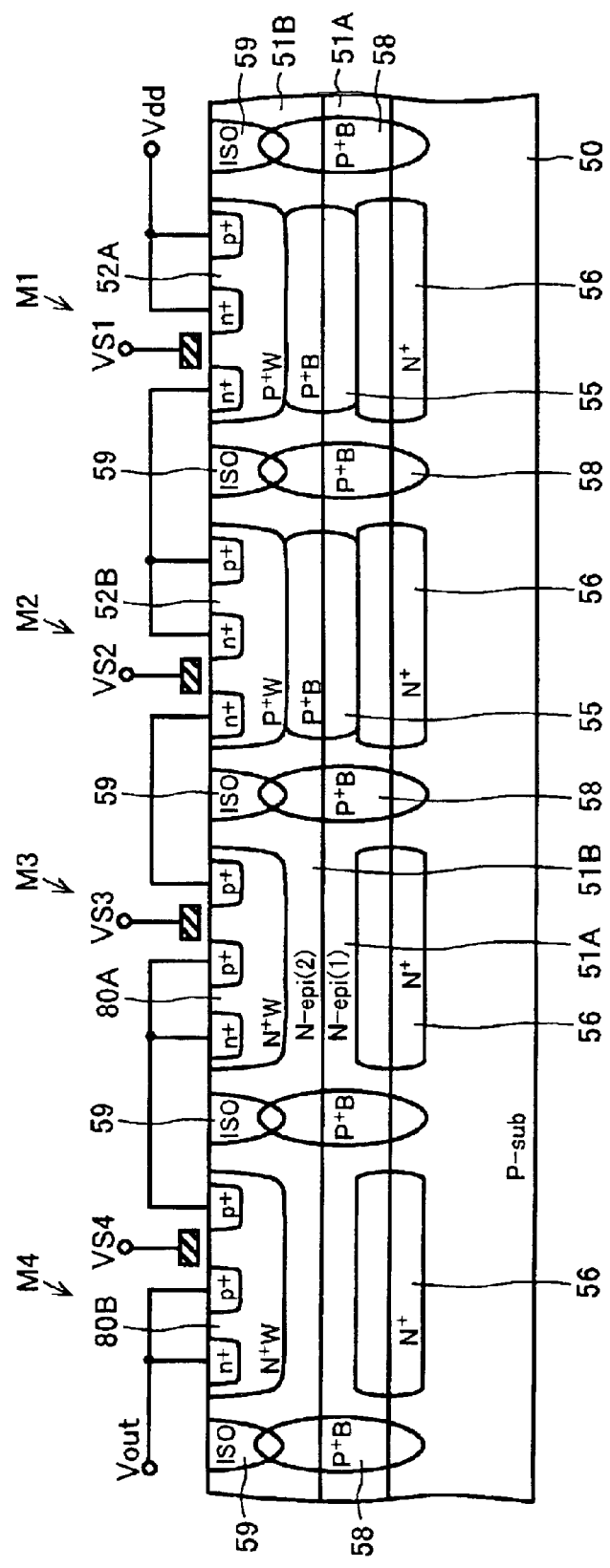
FIG. 17 is a cross-sectional view showing a structure of charge transfer MOS transistors M1, M2, M3 and M4 of the charge pump device according to the fourth embodiment of this invention.
Figure 18:
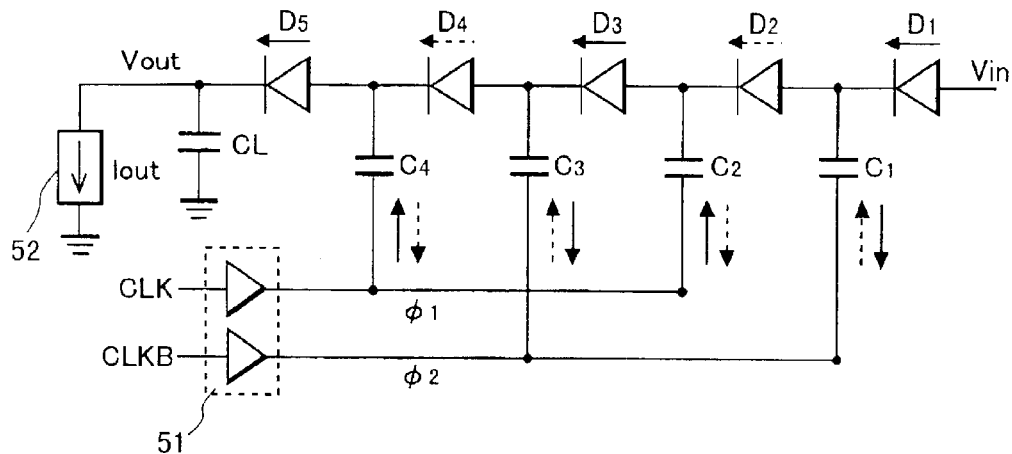
FIG. 18 is a circuit diagram of a four-stage charge pump device according to a conventional art.

FIG. 17 is a cross-sectional view showing structures of the charge transfer MOS transistors M1 M2, M3 and M4 of the charge pump device shown in FIG. 7. The same symbols as in FIG. 12 are given to constituent elements common with those in FIG. 12, and detailed explanation is omitted.

The P-type well regions 52A and 52B and the N-type well regions 80A and 80B are formed adjacent to each other in the second N-type epitaxial silicon layer 51B of the double epitaxial silicon layer structure. These four well regions are separated from each other by the P-type lower isolation layers 58 and the P-type upper isolation layers 59 formed in adjacent regions.

The N-channel charge transfer MOS transistor M1 is formed in the P-type well region 52A and the N-channel charge transfer MOS transistor M2 is formed in the P-type well region 52B. An output voltage VS1 from the inverting level shift circuit S1 is applied to the gate of the N-channel charge transfer MOS transistor M1, and an output voltage VS2 from the inverting level shift circuit S2 is applied to the gate of the N-channel charge transfer MOS transistor M2. The drain layer of the N-channel charge transfer MOS transistor M1 is connected to the P-type well region 52A and the drain layer of the N-channel charge transfer MOS transistor M2 is connected to the P-type well region 52B.

The P-channel charge transfer MOS transistor M3 is formed in the N-type well region 80A and the P-channel charge transfer MOS transistor M4 is formed in the N-type well region 80B. An output voltage VS3 from the non-inverting level shift circuit S3 is applied to the gate of the P-channel charge transfer MOS transistor M3, and an output voltage VS4 from the non-inverting level shift circuit S4 is applied to the gate of the N-channel charge transfer MOS transistor M4.

The drain layer of the P-channel charge transfer MOS transistor M3 is connected to the N-type well region 80A and the drain layer of the P-channel charge transfer MOS transistor M4 is connected to the N-type well region 80B.

The P-type single crystalline silicon substrate 50 is biased to the ground potential or a negative potential, while the N-type epitaxial silicon layer 51B is biased to the output voltage Vout of the charge pump device.

Since the back gate bias effect of the charge transfer MOS transistors M1–M4 is suppressed with above-mentioned charge pump device, the ON resistance is reduced to realize a charge pump device having large current capacity.

Furthermore, robustness against latch up is enhanced, since the charge transfer MOS transistors M1–M4 are formed in the N-type epitaxial silicon layer 51B and are separated from each other with the P-type lower isolation layer 58 and the P-type upper isolation layer 59 so that a thyristor consisting of parasitic bipolar transistors is not formed.

With this invention as described above, the resistance of the P-type well regions 52, 52A and 52B is reduced by the P+-type buried layer 55 and robustness against latch up can be increased. Because of the N+-type buried layer 56, the electric potential of the P-type well regions 52, 52A and 52B can be set independently from the P-type single crystalline silicon substrate 50, and the back gate bias effect (increase in the threshold voltage) can be suppressed by connecting the drain of each of the N-channel MOS transistors formed in the P-type well regions 52, 52A and 52B with each of the P-type well regions 52, 52A and 52B respectively.

Furthermore, because the first and the second epitaxial silicon layers 51A and 51B are stacked, an overlap of the P+-type buried layer 55 and the N+-type buried layer 56 can be reduced, a vertical distance between the source layer and the drain layer of the MOS transistor and the N+-type buried layer can be insured, and a withstand voltage between the source and the drain of the MOS transistor can be secured.

Furthermore, when configuration of the semiconductor device described above is applied to the charge transfer MOS transistor of the charge pump device, robustness against the latch up is enhanced and current capacity is increased because ON resistance of the charge transfer MOS transistor is reduced.

What is claimed is:

1. A semiconductor device comprising:
   a single crystalline semiconductor substrate of a first conductivity type;
   a first epitaxial semiconductor layer of a second conductivity type grown on the single crystalline semiconductor substrate;

a second epitaxial semiconductor layer of the second conductivity type stacked on the first epitaxial semiconductor layer;

a well region of the first conductivity type formed in the second epitaxial semiconductor layer;

a first buried layer of the first conductivity type abutting on a bottom of the well region of the first conductivity type;

a second buried layer of the second conductivity type abutting on a bottom of the first buried layer of the first conductivity type and electrically isolating the well region of the first conductivity type from the single crystalline semiconductor substrate;

an MOS transistor formed in the well region of the first conductivity type, wherein a drain layer of the MOS transistor and the well region of the first conductivity type are electrically connected; and a diffusion layer of the first conductivity type formed in the well region of the first conductivity type, wherein the diffusion layer and the drain layer of the MOS transistor are electrically connected.

2. A semiconductor device comprising:

a single crystalline semiconductor substrate of a first conductivity type;

a first epitaxial semiconductor layer of a second conductivity type grown on the single crystalline semiconductor substrate;

a second epitaxial semiconductor layer of the second conductivity type stacked on the first epitaxial semiconductor layer;

a plurality of well regions of the first conductivity type formed in the second epitaxial semiconductor layer and separated from each other;

an isolation layer of the first conductivity type formed between the well regions of the first conductivity type;

a first buried layer of the first conductivity type abutting on a bottom of each of the well regions of the first conductivity type;

a second buried layer of the second conductivity type abutting on a bottom of the first buried layer of the first conductivity type and electrically isolating each of the well regions of the first conductivity type from the single crystalline semiconductor substrate;

an MOS transistor formed in each of the well regions of the first conductivity type, wherein each of the well regions of the first conductivity type and a drain layer of the MOS transistor therein are electrically connected; and a diffusion layer of the first conductivity type formed in each of the well regions of the first conductivity type, wherein the diffusion layer formed in each of the well regions is electrically connected to the respective drain layer of the MOS transistor in the same well region.

3. A semiconductor device of the claim 2, wherein the isolation layer of the first conductivity type comprises an upper isolation layer diffused from a surface of the second epitaxial semiconductor layer and a lower isolation layer diffused from the first epitaxial semiconductor layer, and a lower portion of the upper isolation layer and an upper portion of the lower isolation layer overlap in the second epitaxial semiconductor layer.

* * * * *